(12) United States Patent
Shimizu et al.

(10) Patent No.: US 9,820,391 B2
(45) Date of Patent: Nov. 14, 2017

(54) WIRING BOARD

(71) Applicant: SHINKO ELECTRIC INDUSTRIES CO., LTD., Nagano (JP)

(72) Inventors: Noriyoshi Shimizu, Nagano (JP); Shoji Watanabe, Nagano (JP); Toshinori Koyama, Nagano (JP); Akio Rokugawa, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 14/613,591

(22) Filed: Feb. 4, 2015

(65) Prior Publication Data
US 2015/0282307 A1 Oct. 1, 2015

(30) Foreign Application Priority Data
Mar. 27, 2014 (JP) ................. 2014-066936

(51) Int. Cl.
H05K 1/02 (2006.01)
H05K 3/46 (2006.01)
(Continued)

(52) U.S. Cl.
CPC ........... H05K 3/4682 (2013.01); H01L 23/15 (2013.01); H01L 23/5383 (2013.01);
(Continued)

(58) Field of Classification Search
CPC ...... H05K 1/036; H05K 1/115; H05K 1/0298; H05K 3/46; H05K 3/427; H05K 3/4682;
(Continued)

(56) References Cited

U.S. PATENT DOCUMENTS 8,929,090 B2 1/2015 Nakashima et al.
9,000,302 B2 * 4/2015 Shimizu ............. H01L 23/5383
174/251
(Continued)

FOREIGN PATENT DOCUMENTS

JP H11-126978 5/1999
JP 2003-069230 3/2003
WO 2011/089936 7/2011

OTHER PUBLICATIONS

Office Action dated Nov. 15, 2016 issued with respect to the basic Japanese Patent Application No. 2014-066936 with full translation.

*Primary Examiner* — Ishwarbhai B Patel
*Assistant Examiner* — Paresh Paghadal
(74) *Attorney, Agent, or Firm* — IPUSA, PLLC

(57) ABSTRACT

A wiring board includes first insulating layers; first wiring layers; first via wirings; second insulating layers; second wiring layers; second via wirings; and a solder resist layer, wherein the first insulating layers are composed of non-photosensitive resin, wherein the second insulating layers, and the solder resist layer are composed of photosensitive resin, respectively, wherein the first surface of the uppermost first insulating layer and the first end surface of the first via wiring embedded in the uppermost first insulating layer are polished surfaces, wherein the first end surface of the first via wiring embedded in the uppermost first insulating layer is flush with the first surface of the uppermost first insulating layer, and wherein the wiring density of the second wiring layers is higher than the wiring density of the first wiring layers.

17 Claims, 20 Drawing Sheets

(51) Int. Cl.
*H05K 1/11* (2006.01)
*H01L 23/15* (2006.01)
*H01L 23/538* (2006.01)
*H01L 23/498* (2006.01)
*H01L 23/00* (2006.01)
*H01L 25/065* (2006.01)
*H01L 25/10* (2006.01)
*H01L 25/18* (2006.01)

(52) U.S. Cl.
CPC .............. *H01L 24/13* (2013.01); *H05K 1/111* (2013.01); *H05K 1/115* (2013.01); *H01L 23/49816* (2013.01); *H01L 23/5389* (2013.01); *H01L 24/11* (2013.01); *H01L 24/16* (2013.01); *H01L 24/29* (2013.01); *H01L 24/32* (2013.01); *H01L 25/0652* (2013.01); *H01L 25/0655* (2013.01); *H01L 25/105* (2013.01); *H01L 25/18* (2013.01); *H01L 2224/10156* (2013.01); *H01L 2224/11462* (2013.01); *H01L 2224/131* (2013.01); *H01L 2224/13014* (2013.01); *H01L 2224/1357* (2013.01); *H01L 2224/13082* (2013.01); *H01L 2224/13083* (2013.01); *H01L 2224/13084* (2013.01); *H01L 2224/13111* (2013.01); *H01L 2224/13116* (2013.01); *H01L 2224/13144* (2013.01); *H01L 2224/13155* (2013.01); *H01L 2224/13164* (2013.01); *H01L 2224/13565* (2013.01); *H01L 2224/13666* (2013.01); *H01L 2224/13687* (2013.01); *H01L 2224/16227* (2013.01); *H01L 2224/2919* (2013.01); *H01L 2224/32225* (2013.01); *H01L 2224/73204* (2013.01); *H01L 2224/8149* (2013.01); *H01L 2224/81191* (2013.01); *H01L 2224/81193* (2013.01); *H01L 2224/81395* (2013.01); *H01L 2224/81444* (2013.01); *H01L 2224/81447* (2013.01); *H01L 2225/1023* (2013.01); *H01L 2225/1058* (2013.01); *H01L 2924/1533* (2013.01); *H01L 2924/15311* (2013.01); *H01L 2924/15331* (2013.01); *H05K 2201/0352* (2013.01); *H05K 2203/025* (2013.01)

(58) Field of Classification Search
CPC ...... H05K 2201/0352; H05K 2203/025; H01L 21/486; H01L 21/4857; H01L 23/15; H01L 23/49822; H01L 23/49827; H01L 2924/1533; H01L 2924/15311; H01L 2224/81447; H01L 2224/81444; H01L 2224/81395; H01L 2224/81193; H01L 2224/81191; H01L 2224/73204; H01L 2224/32225; H01L 2224/2919; H01L 2224/16227; H01L 2224/1357; H01L 2224/13164; H01L 24/13; H01L 24/32; H01L 24/29; H01L 24/16; H01L 24/11; H01L 23/5383; H01L 23/49816; H01L 23/5389; H01L 2225/1058; H01L 2225/1023; H01L 25/18; H01L 25/105; H01L 25/0655; H01L 25/0652

See application file for complete search history.

(56) References Cited

U.S. PATENT DOCUMENTS

| | | | |
|---|---|---|---|
| 2007/0057363 A1* | 3/2007 | Nakamura | H01L 23/49822 257/698 |
| 2008/0093117 A1* | 4/2008 | Oikawa | H01L 23/15 174/262 |
| 2008/0138576 A1* | 6/2008 | Nozu | B32B 18/00 428/138 |
| 2009/0242261 A1* | 10/2009 | Takenaka | H05K 1/0271 174/262 |
| 2010/0005824 A1* | 1/2010 | Kim | F25C 1/08 62/344 |
| 2010/0126765 A1* | 5/2010 | Kim | H05K 3/4007 174/262 |
| 2010/0175917 A1* | 7/2010 | Miyasaka | H01L 23/49838 174/266 |
| 2010/0213605 A1* | 8/2010 | Shimizu | H01L 21/6835 257/700 |
| 2012/0018194 A1* | 1/2012 | Maeda | H05K 3/0035 174/251 |
| 2012/0153463 A1* | 6/2012 | Maeda | H05K 1/115 257/737 |
| 2012/0222894 A1* | 9/2012 | Kaneko | H05K 3/244 174/257 |
| 2012/0234589 A1* | 9/2012 | Furuichi | H05K 3/4682 174/261 |
| 2012/0300425 A1* | 11/2012 | Nakashima | H01L 23/49838 361/761 |
| 2012/0312590 A1* | 12/2012 | Maeda | H05K 1/0269 174/261 |
| 2013/0062108 A1* | 3/2013 | Kondo | H05K 3/4069 174/258 |
| 2013/0140692 A1* | 6/2013 | Kaneko | H05K 1/111 257/737 |
| 2014/0000950 A1* | 1/2014 | Hsu | H05K 1/11 174/261 |
| 2014/0041923 A1* | 2/2014 | Hisada | H05K 1/115 174/266 |
| 2014/0102767 A1* | 4/2014 | Kang | H05K 1/0298 174/251 |
| 2014/0182889 A1* | 7/2014 | Shin | H05K 3/4673 174/251 |
| 2014/0225275 A1* | 8/2014 | Shimizu | H01L 23/49827 257/774 |
| 2015/0053474 A1 | 2/2015 | Nakashima et al. | |

* cited by examiner

WIRING BOARD

CROSS-REFERENCE TO RELATED APPLICATION

The present application is based on and claims the benefit of priority of Japanese Priority Application No. 2014-066936 filed on Mar. 27, 2014, the entire contents of which are hereby incorporated by reference.

BACKGROUND OF THE INVENTION

1. Field of the Invention

The present invention relates to a wiring board.

2. Description of the Related Art

Conventionally, a technique to increase the density of wirings, in other words, a technique to form high-density wiring layers, in a wiring board in which a passive component is included, has been studied. Specifically, a wiring board is known in which a layer including a stacked structure of photosensitive resin, in which the density of wirings is higher (hereinafter, referred to as a "high-density wiring layer"), is formed on a layer composed of a stacked structure of thermosetting resin, in which the density of wirings are lower (hereinafter referred to as a "low-density wiring layer"). Here, the passive component is included in the low-density wiring layer.

For example, Patent Document 1 discloses that in such a wiring board, by adopting a method of embedding a wiring layer formed at a surface of a core substrate, which is the low-density wiring layer, in an insulating layer (thermosetting resin) formed at the surface of the core substrate and forming a high-density wiring layer thereon, the density of wirings of the high-density wiring layer can be made higher.

However, according to the above described method, it is still difficult to form fine wirings on the insulating layer (thermosetting resin) formed at the surface of the core substrate, and it is necessary to form an insulating layer made of photosensitive resin on the insulating layer (thermosetting resin). Then, the fine wirings are formed thereon.

This means that, as it is still difficult to form the fine wirings directly on the insulating layer (thermosetting resin) formed at the surface of the core substrate just by embedding the wiring layer formed at the surface of the core substrate in the insulating layer (thermosetting resin), there remains a problem in actualizing a high-density wiring layer.

PATENT DOCUMENT

[Patent Document 1] Japanese Laid-open Patent Publication No. 11-126978

SUMMARY OF THE INVENTION

The present invention is made in light of the above problems, and provides a wiring board in which a high-density wiring layer is actualized.

According to an embodiment, there is provided a wiring board including a plurality of first insulating layers; a plurality of first wiring layers alternately formed in the plurality of first insulating layers; a plurality of first via wirings formed by filling metal in via holes formed in the plurality of first insulating layers, respectively; a plurality of second insulating layers formed on a first surface of an uppermost first insulating layer of the plurality of first insulating layers; a plurality of second wiring layers alternately formed in the plurality of second insulating layers at the first surface of the uppermost first insulating layer; a plurality of second via wirings formed by filling metal in via holes in the plurality of second insulating layers, respectively; and a solder resist layer formed on a second surface of a lowermost first insulating layer of the plurality of first insulating layers, wherein the plurality of first insulating g layers are composed of non-photosensitive resin, wherein the plurality of second insulating layers, and the solder resist layer are composed of photosensitive resin, respectively, wherein a first end surface of the first via wiring embedded in the uppermost first insulating layer is exposed from the uppermost first insulating layer and is directly connected to a lowermost second wiring layer, the lowermost second wiring layer in the plurality of second wiring layers being formed on the first surface of the uppermost first insulating layer and the first end surface of the first via wiring, wherein the first surface of the uppermost first insulating layer and the first end surface of the first via wiring embedded in the uppermost first insulating layer are polished surfaces, wherein the first end surface of the first via wiring embedded in the uppermost first insulating layer is flush with the first surface of the uppermost first insulating layer, and wherein the wiring density of the plurality of second wiring layers is higher than the wiring density of the plurality of first wiring layers.

According to another embodiment, there is provided a wiring board including a first insulating layer having a first surface and a second surface that is opposite to the first surface of the first insulating layer; a first via wiring formed in a via hole formed in the first insulating layer; a plurality of second insulating layers formed on the first surface of the first insulating layer; a plurality of second wiring layers alternately formed in the plurality of second insulating layers at the first surface of the first insulating layer; a plurality of second via wirings formed in via holes in the plurality of second insulating layers, respectively; and wherein the first insulating layer is composed of non-photosensitive resin, wherein the plurality of second insulating layers are composed of photosensitive resin, wherein a first end surface of the first via wiring embedded in the first insulating layer is exposed from the first surface of the first insulating layer and is electrically connected to a lowermost second wiring layer, the lowermost second wiring layer in the plurality of second wiring layers being directly contacted the first surface of the first insulating layer and the first end surface of the first via wiring, and wherein the wiring density of the plurality of the second wiring layers is higher than the wiring density of the first wiring layer.

Note that also arbitrary combinations of the above-described elements, and any changes of expressions in the present invention, made among methods, devices, systems and so forth, are valid as embodiments of the present invention.

BRIEF DESCRIPTION OF THE DRAWINGS

Other objects, features and advantages of the present invention will become more apparent from the following detailed description when read in conjunction with the accompanying drawings.

DETAILED DESCRIPTION OF THE PREFERRED EMBODIMENTS

Figure 1A:
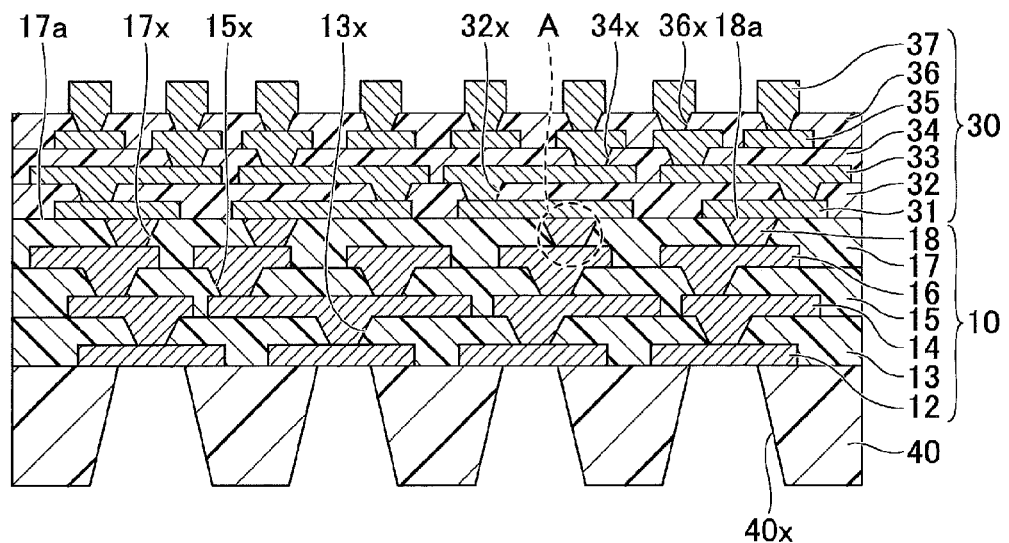
FIG. 1A and FIG. 1B are views illustrating an example of a wiring board of a first embodiment.

The invention will be described herein with reference to illustrative embodiments. Those skilled in the art will recognize that many alternative embodiments can be accomplished using the teachings of the present invention and that the invention is not limited to the embodiments illustrated for explanatory purposes.

It is to be noted that, in the explanation of the drawings, the same components are given the same reference numerals, and explanations are not repeated.

First Embodiment

Structure of Wiring Board of First Embodiment

Figure 1B:
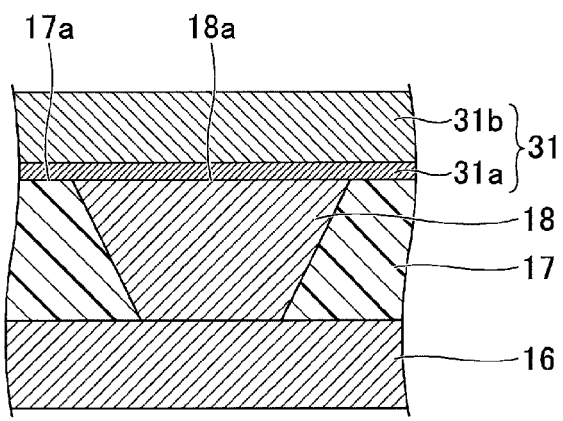

First, a structure of a wiring board of a first embodiment is explained. FIG. 1A and FIG. 1B are views illustrating an example of a wiring board 1 of the first embodiment. FIG. 1B is an enlarged view of a portion "A" in FIG. 1A. With reference to FIG. 1A and FIG. 1B, the wiring board 1 of the first embodiment is a coreless substrate that includes a first wiring component 10, a second wiring component 30 stacked on one side of the first wiring component 10 and a solder resist layer 40 stacked on another side of the first wiring component 10. The plan shape of the wiring board 1 may be a square shape in which the length of each side may be 40 mm, for example. However, the plan shape of the wiring board 1 is not limited so and may have an arbitrary shape.

In this embodiment, a wiring layer 37 side of the wiring board 1 is referred to as an upper side or one side, and a solder resist layer 40 side of the wiring substrate 1 is referred to as a lower side or the other side. Further, a surface of each component at the wiring layer 37 side is referred to as an upper surface or one surface, and a surface at the solder resist layer 40 side is referred to as a lower surface or the other surface. However, the wiring substrate 1 may be used in an opposite direction or may be used at an arbitrary angle. Further, in this embodiment, "in a plan view" means that an object is seen in a direction that is normal to the one surface of the insulating layer 36, and a "plan shape" means a shape of an object seen in the direction that is normal to the one surface of the insulating layer 36.

Hereinafter, the first wiring component 10, the second wiring component 30 and the solder resist layer 40 are explained in detail.

First, the first wiring component 10 is explained. The first wiring component 10 is a low-density wiring layer in which a wiring layer whose density of wirings is lower than that of the second wiring component 30 is formed.

The first wiring component 10 includes a wiring layer 12, an insulating layer 13, a wiring layer 14, an insulating layer 15, a wiring layer 16, an insulating layer 17 and a wiring layer 18 stacked in this order. Here, the insulating layers 13, 15 and 17 are a typical example of a first insulating layer. The wiring layers 14 and 16 are a typical example of a first wiring layer. The wiring layer 18 is a typical example of a first via wiring.

The wiring layer 12 is formed as a lowest layer of the first wiring component 10. The wiring layer 12 may have a structure in which a gold (Au) film, a palladium (Pd) film, a nickel (Ni) film and a copper (Cu) are stacked in this order from the solder resist layer 40 side, for example. In the wiring layer 12, the palladium (Pd) film or the nickel (Ni) film may not be included.

A lower surface of the wiring layer 12 (for the above example, a lower surface of the gold (Au) film) is exposed from a lower surface of the insulating layer 13, and an upper surface (except connecting portions with the wiring layer 14) and a side surface of the wiring layer 12 are covered by the insulating layer 13. The lower surface of the wiring layer 12 may be flush with the lower surface of the insulating layer 13, for example. The thickness of the wiring layer 12 (the total thickness of the films that compose the wiring layer 12) may be about 10 to 20 μm, for example. The plan shape of the wiring layer 12 may be a circular shape, for example, and in such a case, the diameter may be about 40 to 120 µm, for example. The pitch of the wiring layer 12 may be about 100 to 200 µm, for example.

The insulating layer 13 is formed to cover the wiring layer 12. For the material of the insulating layer 13, non-photosensitive insulating resin (thermosetting, for example) including epoxy-based resin or the like as a main constituent may be used, for example. The thickness of the insulating layer 13 may be about 20 to 45 µm, for example. The insulating layer 13 may include filler such as silica ($SiO_2$) or the like.

The wiring layer 14 is formed at one side of the insulating layer 13 and is electrically connected to the wiring layer 12. The wiring layer 14 includes via wirings respectively filled in via holes 13x that are provided to penetrate the insulating layer 13 to expose one surface of the wiring layer 12, and a wiring pattern formed at the one surface of the insulating layer 13. Each of the via holes 13x is a concave portion having an inverse cone trapezoid shape where the diameter of an open portion at an insulating layer 15 side is larger than the diameter of a bottom portion formed at an upper surface of the wiring layer 12. The diameter of the open portion of the via hole 13x at the insulating layer 15 side may be about 60 to 70 µm, for example.

For the material of the wiring layer 14, copper (Cu) or the like may be used, for example. The thickness of the wiring pattern that composes the wiring layer 14 may be about 10 to 20 µm, for example. The line and space (hereinafter, referred to as "line/space") of the wiring layer 14 may be about 20 µm/20 µm, for example. The line of the line/space expresses a wiring width and the space of the line/space expresses a space (wiring space) between adjacent wirings. For example, when the line/space is expressed as 20 µm/20 µm, it means that the wiring width of the wiring is 20 µm and the space between the adjacent wirings is 20 µm.

The insulating layer 15 is formed at the one surface of the insulating layer 13 such that to cover the wiring layer 14. The material or the thickness of the insulating layer 15 may be the same as that of the insulating layer 13, for example. The insulating layer 15 may include filler such as silica ($SiO_2$) or the like.

The wiring layer 16 is formed at one side of the insulating layer 15 and is electrically connected to the wiring layer 14. The wiring layer 16 includes via wirings respectively filled in via hole's 15x that are provided to penetrate the insulating layer 15 to expose one surface of the wiring layer 14, and a wiring pattern formed at the one surface of the insulating layer 15. Each of the via holes 15x is a concave portion having an inverse cone trapezoid shape where the diameter of an open portion at an insulating layer 17 side is larger than the diameter of a bottom portion formed at an upper surface of the wiring layer 14. The diameter of the open portion of the via hole 15x at the insulating layer 17 side may be about 60 to 70 µm, for example. The material of the wiring layer 16 or the thickness or the line/space of the wiring pattern that composes the wiring layer 16 may be the same as that of the wiring layer 14, for example.

The insulating layer 17 is formed at the one surface of the insulating layer 15 such that to cover the wiring layer 16. Further, an upper surface 17a of the insulating layer 17 is a polished surface. The material or the thickness of the insulating layer 17 may be the same as that of the insulating layer 13, for example. The insulating layer 17 may include filler such as silica ($SiO_2$) or the like.

Here, it is not preferable to use a photosensitive insulating resin as the insulating layer 17. As photosensitive insulating resin can only be formed into a layer whose thickness is about 10 µm, it is difficult to compensate for absorb the difference in heights of the wiring layer 16 whose thickness is about 10 to 20 µm and the insulating layer 15. Thus, if the photosensitive insulating resin is used as the insulating layer 17, it is difficult to make an upper surface 17a of the insulating layer 17 flat because the upper surface 17a may reflect a convexo-concave structure formed by upper surfaces of the wiring layer 16 and the insulating layer 15.

The wiring layer 18 is formed as via wirings embedded in the insulating layer 17. Specifically, the wiring layer 18 includes the via wirings respectively filled in via holes 17x that are provided to penetrate the insulating layer 17 to expose one surface of the wiring layer 16, and is electrically connected to the wiring layer 16. Each of the via holes 17x is a concave portion where the area of an open portion at a second wiring component 30 side is larger than the area of a bottom portion formed at an upper surface of the wiring layer 16. For example, when the open portions of each of the via holes 17x at both sides have circular shapes, respectively, each of the via holes 17x is a concave portion having an inverse cone trapezoid shape. At this time, the diameter of the open portion of the via hole 17x at the second wiring component 30 side may be about 60 to 70 µm, for example.

With such a shape of the via hole 17x, the area of one end surface 18a of the wiring layer 18 becomes larger than the area of the other end surface (an end surface at an insulating layer 15 side). The one end surface 18a of the wiring layer 18 may be flush with the upper surface 17a of the insulating layer 17, for example. The one end surface 18a of the wiring layer 18 is exposed from the upper surface 17a of the insulating layer 17, is a polished smooth surface, and is directly connected to a wiring layer 31 of the second wiring component 30. Further, the other end surface of the wiring layer 18 is directly connected to the upper surface of the wiring pattern that composes the wiring layer 16 in the insulating layer 17. The material of the wiring layer 18 may be the same as that of the wiring layer 14, for example.

Here, the upper surface 17a of the insulating layer 17 is a surface that is polished in order to improve its smoothness and the roughness of which is about Ra 15 to 40 nm, for example. This is about ⅒ of the roughness before being polished. Further, the upper surface 17a of the insulating layer 17 is a smooth surface whose roughness is smaller than that of the upper surfaces of the insulating layer 13 and the insulating layer 15, which are made of the same material as the insulating layer 17. By reducing the roughness of the upper surface 17a of the insulating layer 17 and improving its smoothness, it is possible to form the wiring layer 31 that is a fine wiring (high-density wiring pattern) on the upper surface 17a of the insulating layer 17.

As such, according to the embodiment, the wiring layer 18 at the second wiring component 30 side is composed of only the via wirings that are formed in the via holes 17x of the insulating layer 17, respectively. In other words, the wiring layer 18 does not include a wiring pattern that is integrally formed with the via wirings at the upper surface 17a of the insulating layer 17. Although the wiring layer 18 and the wiring layer 31 are electrically connected with each other, they are not integrally formed. With this configuration, the upper surface 17a of the insulating layer 17 can be made into a smooth surface and thus, it is possible to form a high-density wiring pattern (line/space is about 2 µm/2 µm, for example) on the insulating layer 17 as the wiring layer 31.

Here, when the wiring layer 31 is formed by a semi-additive method in the method of manufacturing, which will be explained later, the wiring layer 31 has a stacked structure of a seed layer 31a and an electrolytic plating layer 31b stacked on the seed layer 31a as illustrated in FIG. 1B. Then, the one end surface 18a of the wiring layer 18 is directly connected to the seed layer 31a (a stacked body of a titanium (Ti) layer and a copper (Cu) layer or the like, for example) that composes the wiring layer 31.

Here, in this embodiment, three insulating layers (insulating layers 13, 15 and 17) are included in the first wiring component 10. However, the number of the insulating layers included in the first wiring component 10 may be other than three. Further, in this embodiment, four wiring layers (wiring layers 12, 14, 16 and 18) are included in the first wiring component 10. However, the number of the wiring layers included in the first wiring component 10 may be other than four.

Next, the second wiring component 30 is explained. The second wiring component 30 is a high-density wiring layer in which a wiring layer whose density is higher than that of the first wiring component 10 is formed. The second wiring component 30 includes the wiring layer 31, an insulating layer 32, a wiring layer 33, an insulating layer 34, a wiring layer 35, an insulating layer 36 and a wiring layer 37 stacked in this order on the first wiring component 10. The wiring layer 31 is a typical example of a second wiring layer. The insulating layers 32, 34 and 36 are a typical example of a second insulating layer.

The thickness of the second wiring component 30 (the thickness of a portion including the insulating layers 32, 34 and 36, and the wiring layers 31, 33 and 35) may be about 20 to 40 μm, for example. Here, in this embodiment, it is assumed that the "thickness of the second wiring component 30" does not include projected portions of the wiring layer 37 and indicates the thickness of a portion where only the insulating layer is stacked.

The wiring layer 31 is a wiring pattern that is formed at the upper surface 17a of the insulating layer 17 of the first wiring component 10. A part of the lower surface of the wiring layer 31 contacts the one end surface 18a of the wiring layer 18 of the first wiring component 10 and they are electrically connected with each other. For the material of the wiring layer 31, copper (Cu) or the like may be used, for example. The wiring layer 31 may be a stacked structure of a copper layer and another metal layer, for example. The thickness of the wiring layer 31 may be about 1 to 3 μm, for example. The line/space of the wiring layer 31 may be about 2 μm/2 μm, for example.

The insulating layer 32 is formed on the upper surface 17a of the insulating layer 17 of the first wiring component 10 such that to cover the wiring layer 31. The thickness of the insulating layer 32 is thinner than that of each of the insulating layers 13, 15 and 17. For the material of the insulating layer 32, photosensitive insulating resin including phenol-based resin, polyimide-based resin or the like as a main constituent may be used, for example. The thickness of the insulating layer 32 may be about 5 to 10 μm, for example.

It is preferable that the insulating layer 32 includes an amount of filler (grain size of about 1 μm) less than that of each of the insulating layers 13, 15 and 17, or the insulating layer 32 does not include the filler at all. By reducing the amount of the filler included in the insulating layer 32, formation of a convexo-concave structure at the upper surface due to the filler can be suppressed. Thus, by reducing the formation of the convexo-concave structure at the upper surface of the insulating layer 32, the wiring layer 33 that is formed on the upper surface of the insulating layer 32 can be formed as a high-density wiring pattern. Further, if the amount of the filler is too much, it is difficult to expose the insulating layer 32 by a photolithography method.

The wiring layer 33 is formed at one side of the insulating layer 32 and is electrically connected to the wiring layer 31. The wiring layer 33 includes via wirings respectively filled in via holes 32x that are provided to penetrate the insulating layer 32 to expose one surface of the wiring layer 31, and a wiring pattern formed at the one surface of the insulating layer 32. The via wirings that compose the wiring layer 33 are a typical example of a second via wiring. Each of the via holes 32x is a concave portion having an inverse cone trapezoid shape where the diameter of an open portion at an insulating layer 34 side is larger than the diameter of a bottom portion formed at an upper surface of the wiring layer 31. The diameter of the open portion of the via hole 32x at the insulating layer 34 side may be about 10 to 20 μm, for example.

The material of the wiring layer 33 or the thickness or the line/space of the wiring pattern that composes the wiring layer 33 may be the same as that of the wiring layer 31, for example. Here, the thickness of the wiring layer 31 is about 1 to 3 μm and is thinner than the wiring layer 12 whose thickness is about 15 to 35 μm. Thus, even when the photosensitive insulating resin (the thickness of which is about 5 to 10 μm), that is more difficult to be made thicker compared with the non-photosensitive insulating resin (the thickness of which is about 20 to 45 μm) that composes the first wiring component 10, is used as the insulating layer 32, the upper surface of the insulating layer 32 can be made flat. As a result, the wiring layer 33 which is a high-density wiring pattern same as the wiring layer 31, can be formed on the upper surface of the insulating layer 32.

Further, by using the photosensitive insulating resin as each of the insulating layers that composes the second wiring component 30, via holes can be formed by a photolithography method. Thus, the plan shape of the via hole can be made smaller. When the plan shape of the via hole is made smaller, the plan shape of pads that are connected to the via wirings can also be made smaller. As a result, the wiring layer formed on each of the insulating layers can be advantageously formed as a high-density wiring layer.

Further, as the photosensitive insulating resin of the embodiment does not include the filler (grain size of about 1 μm) at all or includes a small amount of the filler, a convexo-concave structure due to the filler is not easily formed at a surface of each of the insulating layers that composes the second wiring component 30. As a result, the wiring layer formed on each of the insulating layers can be advantageously formed as a high-density wiring layer.

The insulating layer 34 is formed at one surface of the insulating layer 32 such that to cover the wiring layer 33. The material or the thickness of the insulating layer 34 may be the same as that of the insulating layer 32, for example. Due to the same reason as the insulating layer 32, it is preferable that the insulating layer 34 includes an amount of the filler less than that of each of the insulating layers 13, 15 and 17, or the insulating layer 34 does not include the filler at all.

The wiring layer 35 is formed at one side of the insulating layer 34. The wiring layer 35 includes via wirings respectively filled in via holes 34x that are provided to penetrate the insulating layer 34 to expose one surface of the wiring layer 33, and a wiring pattern formed at the one surface of the insulating layer 34. The via wirings that compose the wiring layer 35 are a typical example of the second via wiring. Each of the via holes 34x is a concave portion having an inverse cone trapezoid shape where the diameter of an open portion at an insulating layer 36 side is larger than the diameter of a bottom portion formed at an upper surface of the wiring layer 33. The diameter of the open portion of the via hole 34x at the insulating layer 36 side may be about 10 to 20 μm, for example.

The material of the wiring layer 35 or the thickness or the line/space of the wiring pattern that composes the wiring layer 35 may be the same as that of the wiring layer 31, for example. Here, the thickness of the wiring layer 31 is about 1 to 3 μm and is thinner than the wiring layer 12 whose thickness is about 15 to 35 μm. Thus, even when the photosensitive insulating resin (the thickness of which is about 5 to 10 μm) is used as the insulating layer 34, the upper surface of the insulating layer 34 can be made flat. As a result, the wiring layer 35 which is a high-density wiring pattern same as the wiring layer 31, can be formed on the upper surface of the insulating layer 34.

The insulating layer 36 is formed at one surface of the insulating layer 34 such that to cover the wiring layer 35. The material or the thickness of the insulating layer 36 may be the same as that of the insulating layer 32, for example. Due to the same reason as the insulating layer 32, it is preferable that the insulating layer 36 includes an amount of the filler less than that of each of the insulating layers 13, 15 and 17, or the insulating layer 34 does not include the filler at all.

The wiring layer 37 is formed at one side of the insulating layer. The wiring layer 37 includes via wirings respectively filled in via holes 36x that are provided to penetrate the insulating layer 36 to expose one surface of the wiring layer 35, and pads that project from the one surface of the insulating layer 36. Each of the via holes 36x is a concave portion having an inverse cone trapezoid shape where the diameter of an open portion at a pad side is larger than the diameter of a bottom portion formed at an upper surface of the wiring layer 35. The diameter of the open portion of the via hole 36x at the pad side may be about 10 to 20 μm, for example.

The material of the wiring layer 37 may be the same as that of the wiring layer 31, for example. The thickness of the wiring layer 37 (including the pad portion that projects from the one surface of the insulating layer 36) may be about 10 μm, for example. The plan shape of each of the pads that composes the wiring layer 37 may be a circular shape with a diameter of about 20 to 30 μm, for example. The pitch of the pads that compose the wiring layer 37 may be about 40 to 50 μm, for example. Each of the pads that composes the wiring layer 37 functions as a pad for mounting an electronic component to be electrically connected to the electronic component such as a semiconductor chip or the like.

A surface treatment layer (not illustrated in the drawings) may be formed at a surface (an upper surface and a side surface or only the upper surface) of each of the pads that composes the wiring layer 37. As an example of the surface treatment layer, an Au layer, a Ni/Au layer (a metal layer in which a Ni layer and an Au layer are stacked in this order), a Ni/Pd/Au layer (a metal layer in which a Ni layer, a Pd layer and an Au layer are stacked in this order) or the like may be used. Alternatively, the surface treatment layer may be formed by performing an antioxidation process such as an Organic Solderability Preservative (OSP) process or the like at the surface (the upper surface and the side surface or only the upper surface) of each of the pads that compose a the wiring layer 37.

Next, the solder resist layer 40 is explained. The solder resist layer 40 is stacked at the other side of the first wiring component 10. Specifically, the solder resist layer 40 is an outermost insulating layer formed at the lower surface of the insulating layer 13 such that to selectively expose the wiring layer 12. For the material of the solder resist layer 40, photosensitive, insulating resin (thermosetting, for example) including phenol-based resin, polyimide-based resin or the like as a main constituent may be used, for example. The solder resist layer 40 may include filler such as silica ($SiO_2$) or the like.

The solder resist layer 40 is provided with open portions 40x and a part of the wiring layer 12 of the first wiring component 10 is exposed at a bottom portion of each of the open portions 40x. The wiring layer 12 that is exposed at the bottom portion of each of the open portions 40x functions as a pad to be electrically connected to a mounting substrate such as a mother board or the like, for example. Here, the surface treatment layer as described above may be formed at the lower surface of the wiring layer 12 that is exposed at the bottom portion of each of the open portions 40x.

By improving the balance of the wiring board 1 at an upper side and a lower side by adjusting the thickness of the solder resist layer 40 with respect to the thickness of the insulating layers that compose the second wiring component 30 (the total thickness of the insulating layers 32, 34 and 36), the wiring board 1 may have a structure resistant to warping. For example, the thickness of the solder resist layer 40 may be the same as the thickness of the insulating layers that compose the second wiring component 30 (the total thickness of the insulating layers 32, 34 and 36) or thicker than the second wiring component 30.

For each of the insulating layers 13, 15 and 17 that includes non-photosensitive insulating resin as a main constituent in the wiring board 1, it is preferable that the elastic coefficient (modulus of transverse elasticity=modulus of rigidity) is about 5 to 15 GPa and the coefficient of thermal expansion (linear coefficient of expansion) is about 10 to 40 ppm/° C. Further, for each of the insulating layers 32, 34 and 36 that includes photosensitive insulating resin as a main constituent, it is preferable that the elastic coefficient is about 5 GPa and the coefficient of thermal expansion is about 50 to 70 ppm/° C. Further, for the solder resist layer 40 that includes photosensitive insulating resin as a main constituent, it is preferable that the elastic coefficient is about 2 to 4 GPa and the coefficient of thermal expansion is about 40 to 50 ppm/° C.

The coefficient of thermal expansion of each of the insulating layers may be adjusted to a predetermined value by the amount of the filler, for example. However, for the insulating layer including the photosensitive resin as a main constituent, if the amount of the filler is too much, it is impossible to perform exposure. Thus, there is a limitation (an upper limitation) for the amount of the filler capable of being included. Thus, the coefficient of thermal expansion of the insulating layer including the photosensitive insulating resin as a main constituent tends to be larger than the coefficient of thermal expansion of the insulating layer including the non-photosensitive insulating resin as a main constituent. For the filler, kaoline ($Al_2Si_2O_5(OH_4)$), talc ($Mg_3Si_4O_{10}(OH_2)$), alumina ($Al_2O_3$) or the like may be used instead of the above described silica ($SiO_2$). Alternatively, these may be mixed.

By setting physical property values (elastic coefficient and coefficient of thermal expansion) as such, the wiring board 1 is formed to have a structure in which outside parts become softer while having the first wiring component 10 at center. Thus, according to the multiplier effect with the relationship of the above described thicknesses of the solder resist layer 40 and the second wiring component 30, warp of the wiring board 1 can be suppressed.

(Method of Manufacturing Wiring Board of First Embodiment)

Next, a method of manufacturing the wiring board 1 of the first embodiment is explained. FIG. 2A to FIG. 9B are views illustrating an example of manufacturing steps of the wiring board 1 of the first embodiment. Although an example of a manufacturing step in which a part corresponding to a plurality of wiring boards is firstly manufactured and then, the plurality of wiring boards are obtained by individualizing the part in this embodiment, a manufacturing step in which each single wiring board is manufactured may be alternatively used.

FIG. 2A to FIG. 4A illustrate steps of manufacturing the first wiring component 10. First, in a step illustrated in FIG. 2A, a support body 250 is prepared. For the support body 250, a metal film, a glass plate, a silicon substrate or the like may be used. In this embodiment, a copper film is used for the support body 250. This is because the copper film can be used as a power supply layer when performing electrolytic plating in a step illustrated in FIG. 2B or the like, which will be explained later, and also the copper film can be easily removed by etching in a step illustrated in FIG. 9A, which will be explained later. The thickness of the support body 250 may be about 35 to 105 μm, for example.

Next, a resist layer 300 provided with open portions 300x corresponding to the wiring layer 12 is formed at one surface 250a of the support body 250. Specifically, liquid or paste resist composed of photosensitive resin composition including epoxy-based resin, acrylic-based resin or the like is coated on the one surface 250a of the support body 250, for example. Alternatively, a film resist (a dry film resist or the like, for example) composed of photosensitive resin composition including epoxy-based resin, acrylic-based resin or the like is laminated on the one surface 250a of the support body 250, for example.

Then, the open portions 300x are formed by exposing and developing the coated or laminated resist. With this, the resist layer 300 provided with the open portions 300x is formed. Alternatively, a film resist previously provided with the open portions 300x may be laminated on the one surface 250a of the support body 250. The open portions 300x are formed at positions corresponding to the wiring layer 12. The pitch of the open portions 300x may be about 100 to 200 μm, for example. The plan shape of each of the open portions 300x may be a circular shape, for example, and whose diameter may be about 40 to 120 μm, for example.

Figure 2A:
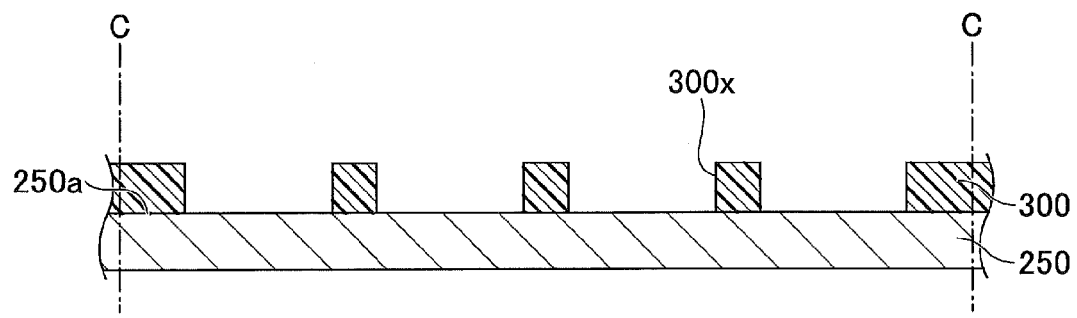
FIG. 2A to FIG. 2C are views illustrating an example of manufacturing steps of the wiring board of the first embodiment.
Figure 2B:
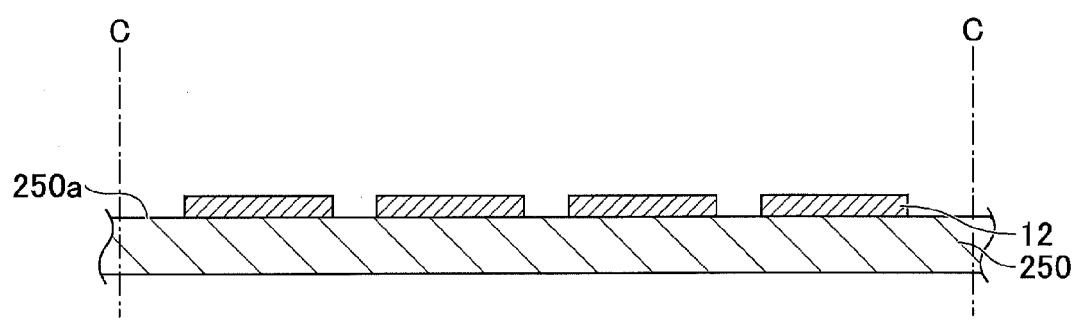

Next, in a step illustrated in FIG. 23, the wiring layer 12 is formed on the one surface 250a of the support body 250 in each of the open portions 300x by electroplating or the like using the support body 250 as a power supply layer. Specifically, by the electroplating or the like using the support body 250 as the power supply layer, a gold (Au) film, a palladium (Pd) film and a nickel (Ni) film are stacked in this order, and then, a copper (Cu) film is stacked. Here, in the wiring layer 12, the palladium (Pd) film or the nickel (Ni) film may not be formed. After forming the wiring layer 12, the resist layer 300 illustrated in FIG. 2A is removed.

Figure 2C:
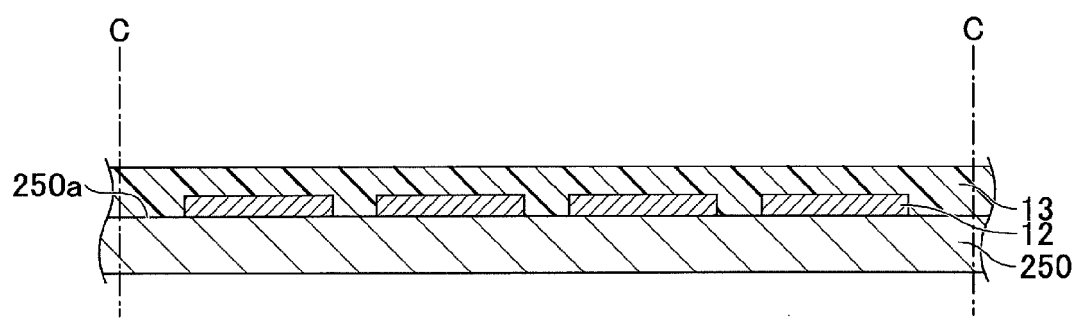

Next, in a step illustrated in FIG. 2C, the insulating layer 13 is formed at the one surface 250a of the support body 250 such that to cover the wiring layer 12. For the material of the insulating layer 13, non-photosensitive insulating resin (thermosetting) including epoxy-based resin or the like as a main constituent may be used, for example. The thickness of the insulating layer 13 may be about 20 to 45 μm, for example. The insulating layer 13 may include filler such as silica ($SiO_2$) or the like.

When the non-photosensitive insulating resin (thermosetting) in a film form including epoxy-based resin as a main constituent is used as the material of the insulating layer 13, the insulating resin film is laminated on the one surface 250a of the support body 250 such that to cover the wiring layer 12. Then, the insulating layer 13 is formed by heating the insulating resin to a temperature greater than or equal to its curing temperature while pressing the laminated insulating resin to cure. Here, by laminating the insulating resin under vacuum atmosphere, generation of voids can be suppressed.

Meanwhile, when the non-photosensitive insulating resin (thermosetting) in a liquid or paste form including epoxy-based resin as a main constituent is used as the material of the insulating layer 13, the liquid or paste insulating resin is coated on the one surface 250a of the support body 250 such that to cover the wiring layer 12. The liquid or paste insulating resin may be coated by spin coating or the like, for example. Then, the insulating layer 13 is formed by heating the coated insulating resin to a temperature greater than or equal to its curing temperature to cure.

Here, before forming the insulating layer 13, the upper surface of the wiring layer 12 may be roughened so that adhesion between the wiring layer 12 and the insulating layer 13 can be improved. The roughing of the upper surface of the wiring layer 12 may be performed by wet etching using formic acid, for example.

Figure 3A:
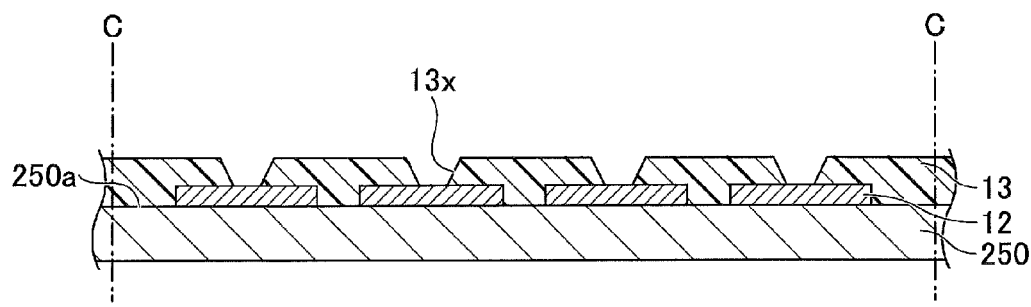
FIG. 3A to FIG. 3C are views illustrating an example of manufacturing steps of the wiring board of the first embodiment.

Next, in a step illustrated in FIG. 3A, the via holes 13x that penetrate the insulating layer 13 and expose the upper surface of the wiring layer 12 are formed in the insulating layer 13. The via holes 13x may be formed by a laser processing or the like using $CO_2$ laser or the like, for example. When the via holes 13x are formed by the laser processing, a desmear process may be performed to remove resin residue adhered at a surface of the wiring layer 12 at the bottom portions of the via holes 13x.

Figure 3B:
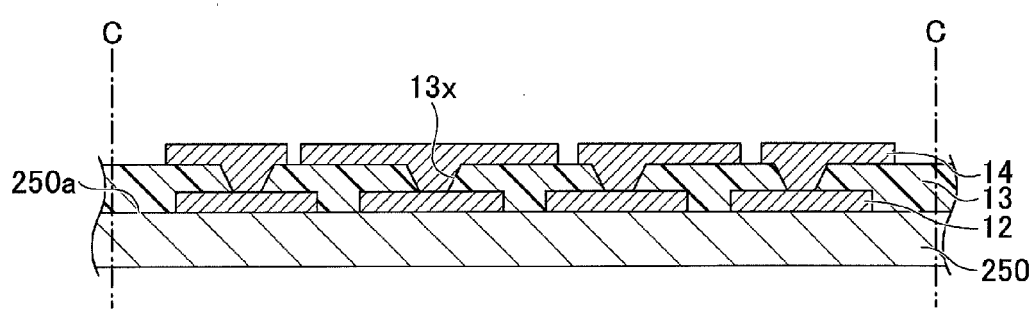

Next, in a step illustrated in FIG. 3B, the wiring layer 14 is formed on the one side of the insulating layer 13. The wiring layer 14 includes via wirings respectively filled in via holes 13x that are provided to penetrate the insulating layer 13 to expose one surface of the wiring layer 12, and a wiring pattern formed at the one surface of the insulating layer 13. The wiring layer 14 is electrically connected to the wiring layer 12 that is exposed at a bottom portion of each of the via holes 13x.

For the material of the wiring layer 14, copper (Cu) or the like may be used, for example. The wiring layer 14 may be formed by various methods of forming a wiring such as a semi-additive method, a subtractive method or the like. As an example, a method of forming the wiring layer 14 using the semi-additive method is explained in the following.

First, a seed layer (not illustrated in the drawings) made of copper (Cu) or the like is formed on the insulating layer 13 including the upper surface of the wiring layer 12 that is exposed at the bottom portion of each of the via holes 13x and the inner wall surface of each of the via holes 13x by electroless plating or sputtering. Further, a resist layer (not illustrated in the drawings) provided with open portions corresponding go the wiring layer 14 is formed on the seed layer. Then, an electrolytic plating layer (not illustrated in the drawings) made of copper (Cu) or the like is formed at the open portions of the resist layer by electroplating using the seed layer as a power supply layer.

Subsequently, after removing the resist layer, a part of the seed layer that is not covered by the electrolytic plating layer is removed by etching using the electrolytic plating layer as a mask. With this, the wiring layer 14 in which the electrolytic plating layer is stacked on the seed layer is formed. This means that the wiring layer 14 including the via wirings respectively filled in the via holes 13x, and the wiring pattern formed on the insulating layer 13, are formed on the insulating layer 13.

Here, at this time, each of the wiring layers 14 has a stacked structure of the seed layer and the electrolytic plating layer formed on the seed layer, the seed layer is not illustrated in the drawings (this is the same for the other wiring layers).

Next, in a step illustrated in FIG. 3C, by repeating the steps same as those explained with reference to FIG. 2C to FIG. 3B, the insulating layer 15, the wiring layer 16, the insulating layer 17 and the metal layer 180 are stacked on the insulating layer 13. The material, the thickness or the like of each of the layers is the same as that explained above for the structure of the wiring board 1.

Figure 4A:
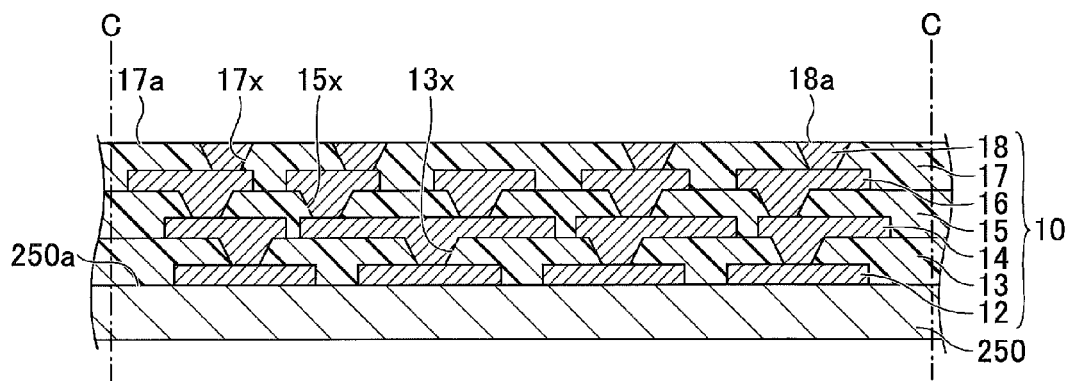
FIG. 4A and FIG. 4B are views illustrating an example of manufacturing steps of the wiring board of the first embodiment.

Here, the metal layer 180 becomes the wiring layer 18 in a step illustrated in FIG. 4A, and the metal layer 180 is formed to fill the via holes 17x and also extend on the upper surface 17a of the insulating layer 17. The metal layer 180 may be formed at the entirety of the upper surface 17a of the insulating layer 17, for example. However, as a part of the metal layer 180 that is formed on the upper surface 17a of the insulating layer 17 is removed by polishing in the following step, the metal layer 180 may be formed to fill the via holes 17x and may be formed on the upper surface 17a of the insulating layer 17 only in the vicinity of the via holes 17x.

For example, when the metal layer 180 is formed on the entirety of the upper surface 17a of the insulating layer 17, in the semi-additive method as explained above with reference to FIG. 3B, after forming the seed layer, the electrolytic plating layer may be formed at the entirety of the seed layer without forming the resist layer.

Next, in a step illustrated in FIG. 4A, the metal layer 180 is polished to expose the upper surface 17a of the insulating layer 17 and an upper surface of the metal layer 180 that is filled in the via holes 17x to form the wiring layer 18 including the via wirings filled in the via holes 17x, respectively. The one end surface 18a of the wiring layer 18 may be flush with the upper surface 17a of the insulating layer 17, for example.

Figure 3C:
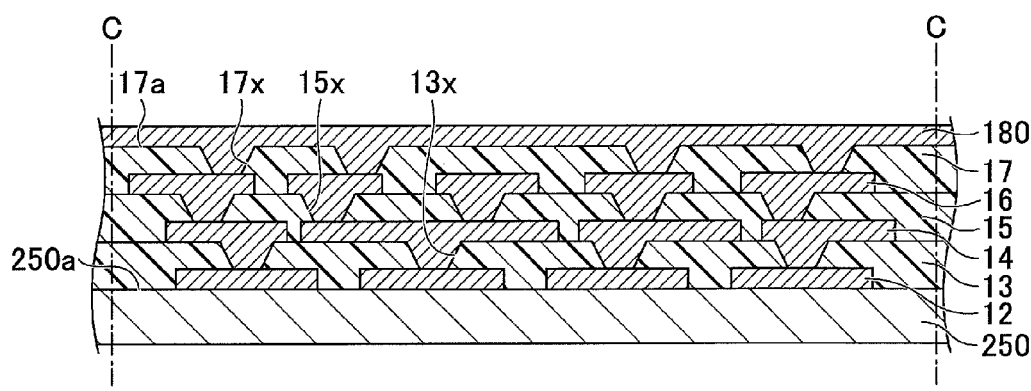

The wiring layer 18 may be formed by polishing and removing the metal layer 180 except the parts filled in the via holes 17x by chemical mechanical polishing (CMP) or the like as illustrated in FIG. 3C, for example. At this time a part of the upper surface 17a of the insulating layer 17 may be removed at the same time. The upper surface 17a of the insulating layer 17 may be removed for about 3 to 5 μm, for example.

Here, by polishing the upper surface 17a of the insulating layer 17 with the metal layer 180 and removing the part of the upper surface 17a of the insulating layer 17, roughness of the upper surface 17a of the insulating layer 17 can be made smaller compared with that of before polishing. This means that smoothness of the upper surface 17a of the insulating layer 17 can be improved.

The roughness of the upper surface 17a of the insulating layer 17 before performing CMP (before polishing) may be about Ra 300 to 400 nm, and the roughness of the upper surface 17a of the insulating layer 17 can be about Ra 15 to 40 nm by performing CMP, for example. As such, by reducing the roughness of the upper surface 17a of the insulating layer 17 to improve the smoothness, fine wirings (high-density wiring pattern) can be formed in the subsequent process. With the above processes, the first wiring component 10 is formed.

FIG. 4B to FIG. 8B illustrate steps of manufacturing the second wiring component 30. First, in steps illustrated in FIG. 4B to FIG. 5B, the wiring layer 31 that is patterned into a predetermined plan shape is formed on the upper surface 17a of the insulating layer 17 of the first wiring component 10. The wiring layer 31 is electrically connected to the wiring layer 18 of the first wiring component 10. The wiring layer 31 may be formed by a semi-additive method or the like.

Figure 4B:
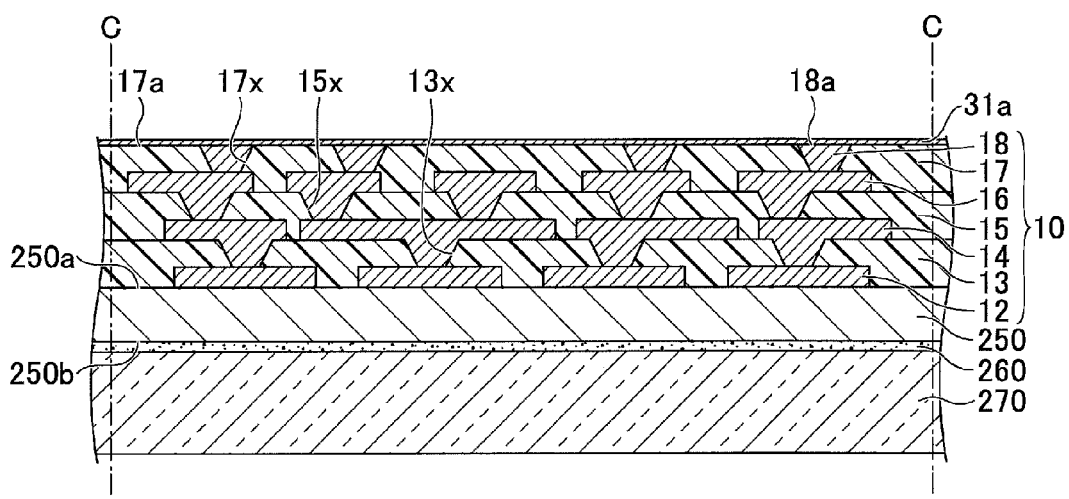

Specifically, first, as illustrated in FIG. 4B, a reinforcing substrate 270 is adhered to another surface 250b of the support body 250 via an adhesion layer 260. By adding the reinforcing substrate 270 in addition to the support body 250, it is easy to handle the stacked structure when manufacturing a high-density wiring layer.

For the adhesion layer 260, a UV (ultraviolet light) double-sided form type adhesive tape or the like that has adhesion under natural light but is easily removed when ultraviolet light is irradiated due to lowering of adhesion may be used, for example. Alternatively, for the adhesion layer 260, a thermal double-sided form type adhesive tape or the like that has adhesion under room temperature but is easily removed when being heated due to lowering of adhesion may be used, for example. Alternatively, for the adhesion layer 260, a double-sided adhesive tape or the like capable of being mechanically removed may be used.

For the reinforcing substrate 270, a glass plate, a metal plate, a silicon substrate or the like may be used, for example. However, when the UV (ultraviolet light) double-sided form type adhesive tape is used as the adhesion layer 260, a glass plate that transmits UV (ultraviolet light) may be used. The thickness of the reinforcing substrate 270 may be about 200 μm, for example.

Next, a seed layer 31a is formed on a flat surface formed by the upper surface 17a of the insulating layer 17 and the one end surface 18a of the wiring layer 18 by stacking a titanium (Ti) layer and a copper (Cu) layer by sputtering, for example. The thickness of the titanium (Ti) layer may be about 20 to 50 nm, for example, and the thickness of the copper (Cu) layer may be about 100 to 300 nm, for example. By forming the titanium (Ti) layer as a lower layer of the seed layer 31a, adhesion between the insulating layer 17 and the wiring layer 31 can be improved. Instead of using titanium (Ti), titanium nitride (TiN) or the like may be used. Here, titanium (Ti) or titanium nitride (TIN) has a corrosion resistance higher than that of copper. Further, the seed layer 31a may be formed by electroless plating. However, sputtering may be preferably used for forming a high-density wiring layer as a thinner film can be formed by sputtering.

Figure 5A:
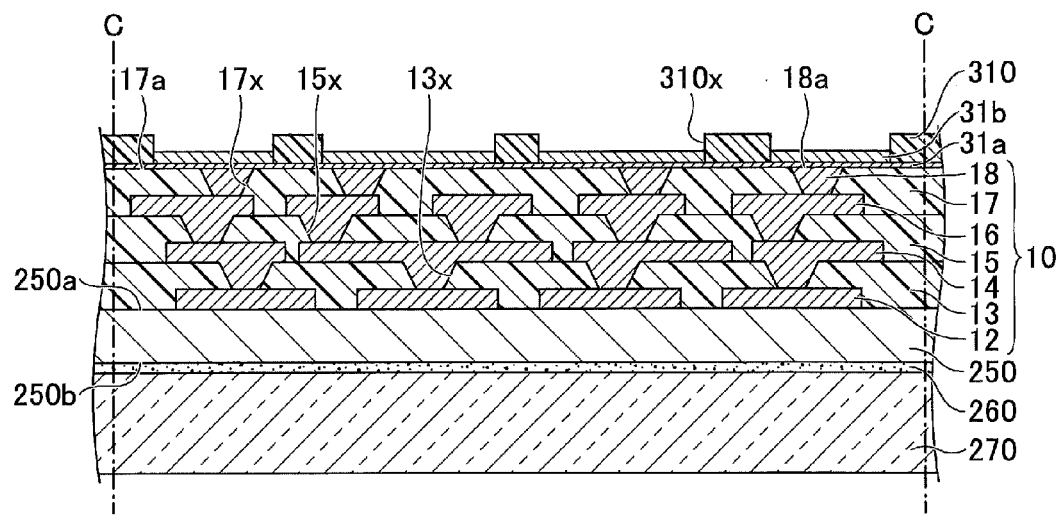
FIG. 5A and FIG. 5B are views illustrating an example of manufacturing steps of the wiring board of the first embodiment.

Next, as illustrated in FIG. 5A, a resist layer 310 provided with open portions 310x corresponding to the wiring layer 31 is formed on the seed layer 31a. Then, an electrolytic plating layer 31b made of copper (Cu) or the like is formed at the open portions 310x of the resist layer 310 by electroplating using the seed layer 31a as a power supply layer.

Figure 5B:
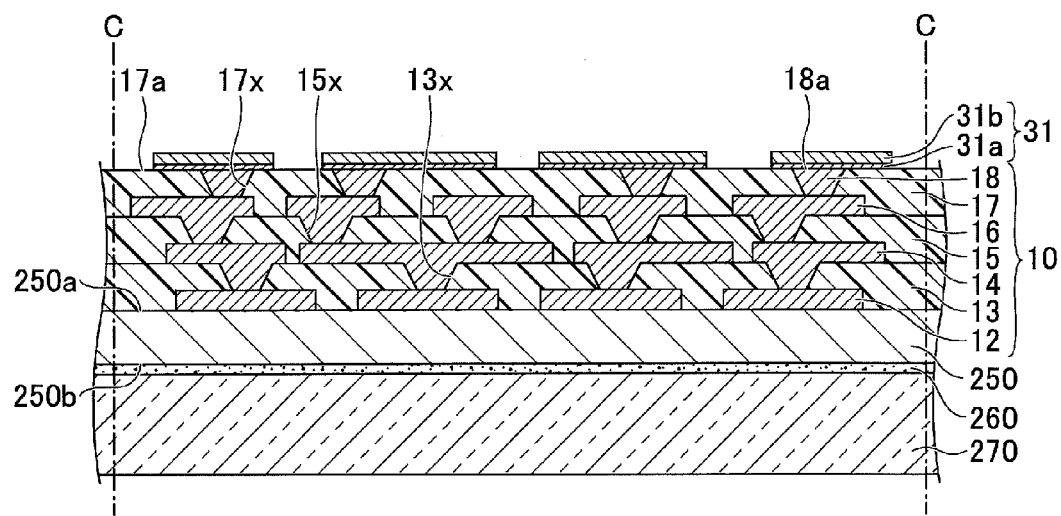

Next, as illustrated in FIG. 5B, after removing the resist layer 310 illustrated in FIG. 5A, the seed layer 31a that is not covered by the electrolytic plating layer 31b is etched using the electrolytic plating layer 31b as a mask. With this, the wiring layer 31 including the seed layer 31a and the electrolytic plating layer 31b stacked on the seed layer 31a is formed. The one end surface 18a of the wiring layer 18 is connected to the electrolytic plating layer 31b via the seed layer 31a, of the wiring layer 31. The thickness of the wiring layer 31 (total thickness of the seed layer 31a and the electrolytic plating layer 31b) may be about 1 to 3 μm, for example. The line/space of the wiring layer 31 may be about 2 μm/2 μm, for example.

Before forming the seed layer 31a, a plasma process such as O₂ plasma ashing or the like may be performed on the upper surface 17a of the insulating layer 17. By performing the plasma process, the upper surface 17a of the insulating layer 17 can be roughened. By roughing the upper surface 17a of the insulating layer 17, adherence with the seed layer 31a can be increased. However, as described above, by reducing the roughness of the upper surface 17a of the insulating layer 17 to improve smoothness, fine wirings can be formed. If the process of roughening the upper surface 17a of the insulating layer 17 is performed, the upper surface 17a of the insulating layer 17 is roughed to an amount that does not cause an influence in forming the fine wirings.

Figure 6A:
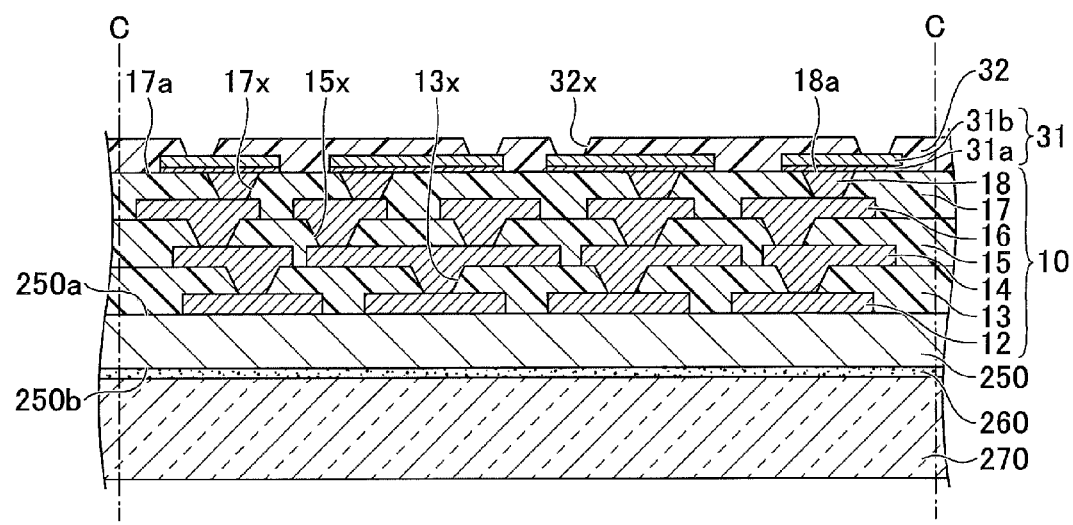
FIG. 6A and FIG. 6B are views illustrating an example of manufacturing steps of the wiring board of the first embodiment.

Next, in a step illustrated in FIG. 6A, the insulating layer 32 is formed on the upper surface 17a of the insulating layer 17 of the first wiring component 10 such that to cover the wiring layer 31. Then, the via holes 32x are formed in the insulating layer 32 to penetrate in the insulating layer 32 to expose the upper surface of the wiring layer 31. For the material of the insulating layer 32, photosensitive insulating resin including phenol-based resin, polyimide-based resin or the like as a main constituent may be used, for example. The thickness of the insulating layer 32 may be about 5 to 10 μm, for example. The insulating layer 32 may include filler such as silica (SiO₂) or the like.

The specific method of forming the insulating layer 32 is the same as that for the insulating layer 13 explained above with reference to FIG. 3A. At this time, the insulating layer 32 is not cured yet. The via holes 32x may be formed by photolithography, for example. In other words, the via holes 32x are formed by exposing and developing the insulating layer 32 including the photosensitive insulating resin as a main constituent and then curing the insulating layer 32.

Figure 6B:
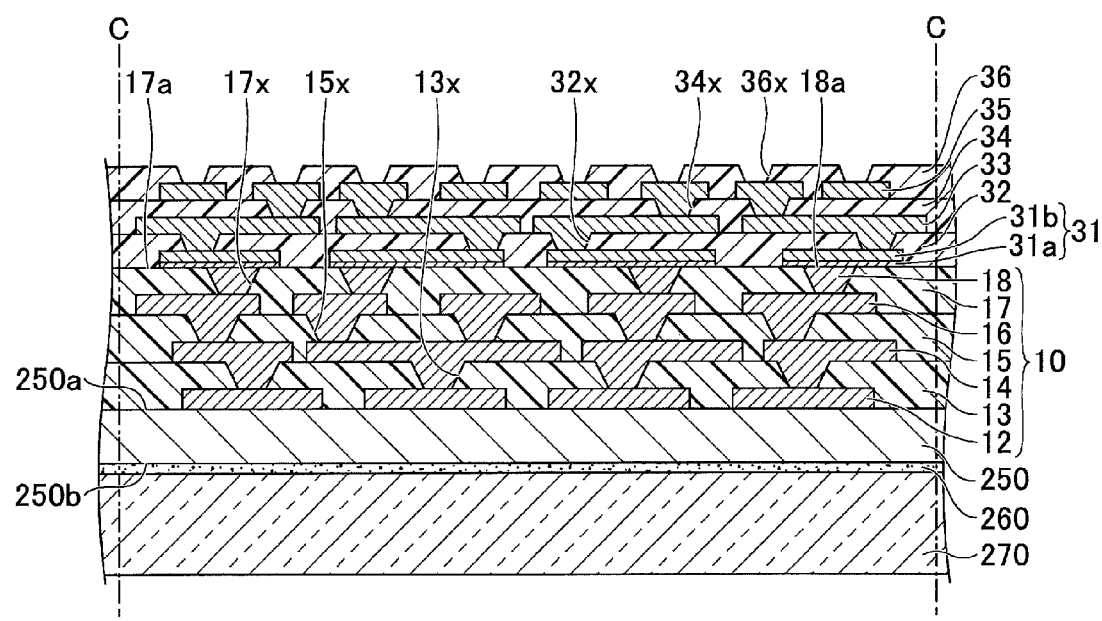

Next, in a step illustrated in FIG. 6B, the wiring layer 33, the insulating layer 34, the wiring layer 35 and the insulating layer 36 are stacked on the insulating layer 32 by repeating the steps as described above with reference to FIG. 2C and FIG. 3B. Thereafter, the insulating layer 36 is provided with the via holes 36x that penetrate the insulating layer 36 to expose the upper surface of the wiring layer 35. The material, the thickness, the diameter or the like of each of the layers may be the same as those explained above with reference to the explanation of the structure of the wiring board 1.

Figure 7A:
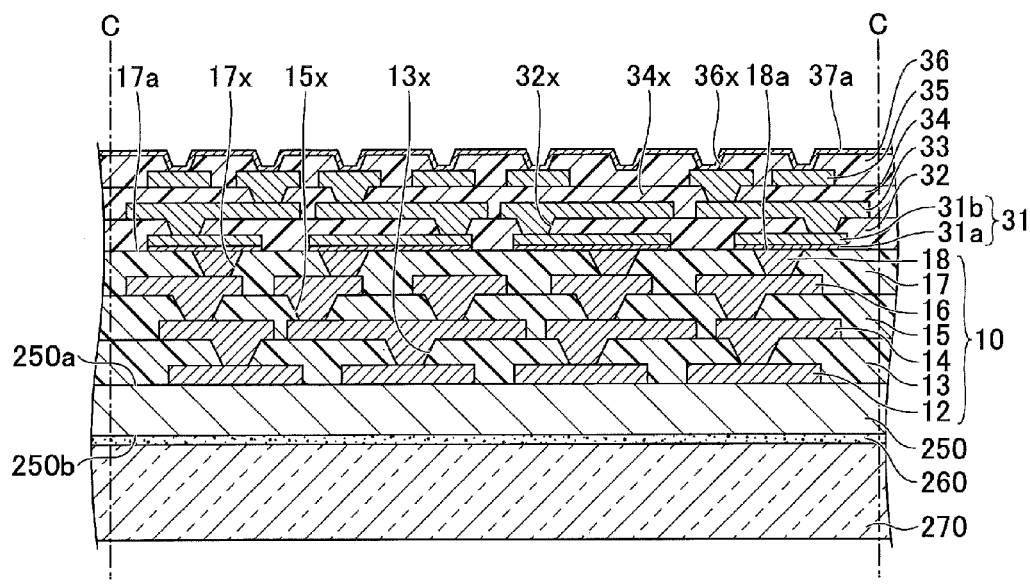
FIG. 7A and FIG. 7B are views illustrating an example of manufacturing steps of the wiring board of the first embodiment.

Next, in a step illustrated in FIG. 7A, a seed layer 37a that continuously covers the upper surface of the wiring layer 35 exposed at the bottom portion of each of the via holes 36x, the inner wall surface of each of the via holes 36x and the upper surface of the insulating layer 36 is formed by electroless plating or sputtering, for example. The seed layer 37a may be formed by stacking a titanium (Ti) layer and a copper (Cu) layer, for example. The thickness of the titanium (Ti) layer may be about 20 to 50 nm, for example, and the thickness of the copper (Cu) layer may be about 100 to 300 nm, for example. Titanium nitride (TiN) or the like may be used instead of titanium (Ti).

Figure 7B:
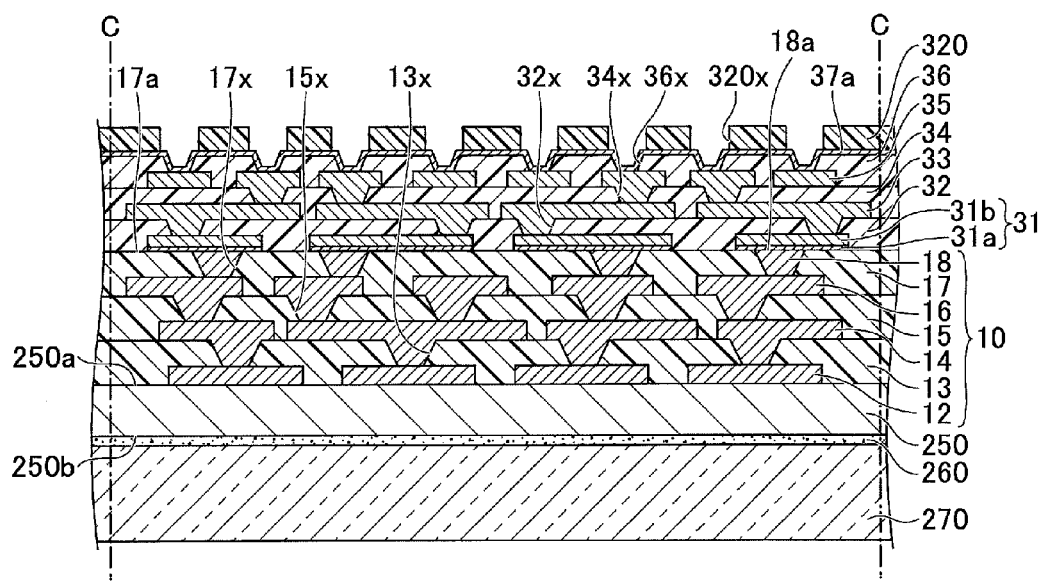

Next, in a step illustrated in FIG. 7B, a resist layer 320 provided with open portions 320x corresponding to the wiring layer 37 is formed on the seed layer 37a that is formed on the upper surface of the insulating layer 36. Next, in a step illustrated in FIG. 8A, an electrolytic plating layer 37b made of copper (Cu) or the like is formed at the open portions 320x of the resist layer 320 by electroplating using the seed layer 37a as a power supply layer.

Figure 8A:
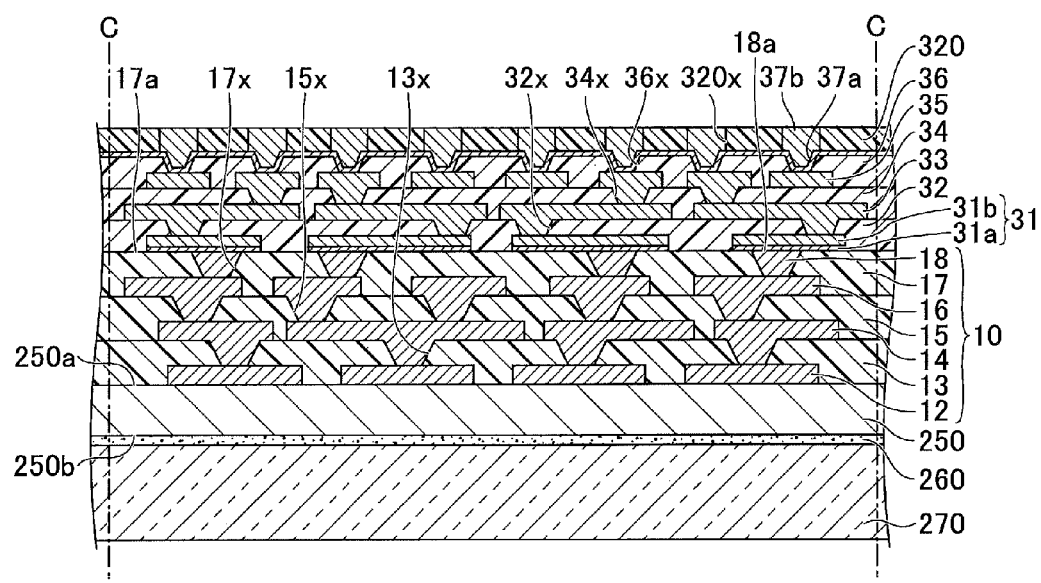
FIG. 8A and FIG. 8B are views illustrating an example of manufacturing steps of the wiring board of the first embodiment.
Figure 8B:
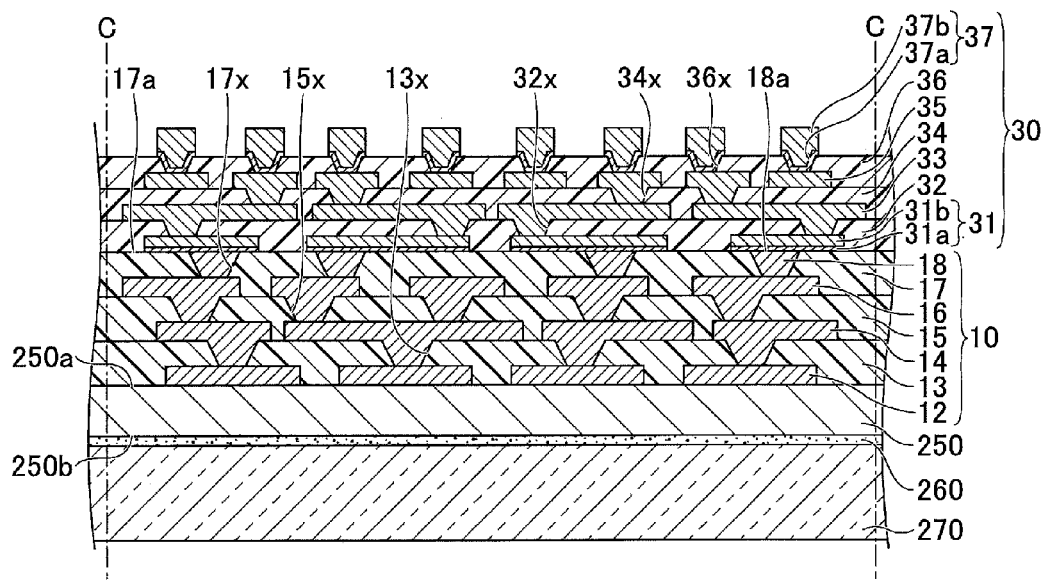

Next, in a step illustrated in FIG. 8B, after removing the resist layer 320 illustrated in FIG. 8A, the seed layer 37a that is not covered by the electrolytic plating layer 37b is removed by etching using the electrolytic plating layer 37b as a mask. With this, the wiring layer 37 including the seed layer 37a and the electrolytic plating layer 37b stacked on the seed layer 37a is formed. The plan shape of each of the pads that composes the wiring layer 37 may be a circular shape whose diameter is about 20 to 30 μm, for example. Thereafter, the surface treatment layer as described above may be formed at the surface (an upper surface and a side surface, or only at the upper surface) of each of the pads of the wiring layer 37. With the above steps, the second wiring component 30 is formed.

Figure 9A:
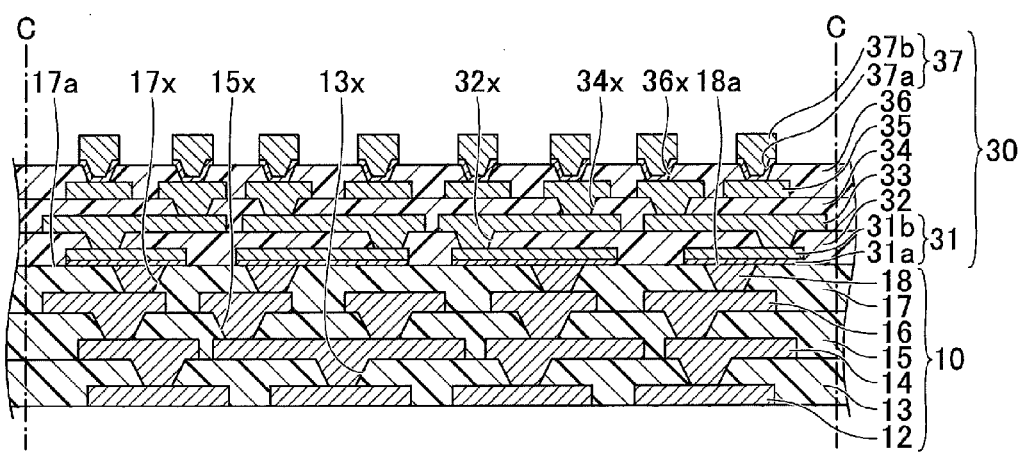
FIG. 9A and FIG. 9B are views illustrating an example of manufacturing steps of the wiring board of the first embodiment.

Next, in a step illustrated in FIG. 9A, after removing the reinforcing substrate 270, the support body 250 is also removed. For example, when the UV (ultraviolet light) double-sided form type adhesive tape is used as the adhesion layer 260 and the glass plate is used as the reinforcing substrate 270, ultraviolet light is irradiated on the adhesion layer 260 via the reinforcing substrate 270 from a lower surface side of the reinforcing substrate 270. With this, adhesion of the adhesion layer 260 is lowered and the reinforcing substrate 270 can be easily removed from the support body 250.

The support body 250 that is made of a copper film can be removed by wet-etching using ferric chloride aqueous solution, cupric chloride aqueous solution, ammonium persulfate aqueous solution or the like, for example. At this time, if the surface treatment layer such as a gold (Au) film or the like is formed at the surface of the wiring layer 37 that is exposed from the insulating layer 36, the support body 250 made of the copper film can be selectively etched. However, if copper (Cu) is exposed at the surface of the wiring layer 37 that is exposed from the insulating layer 36, it is necessary to mask the wiring layer 37 in order to prevent the wiring layer 37 from being removed with the support body 250.

Figure 9B:
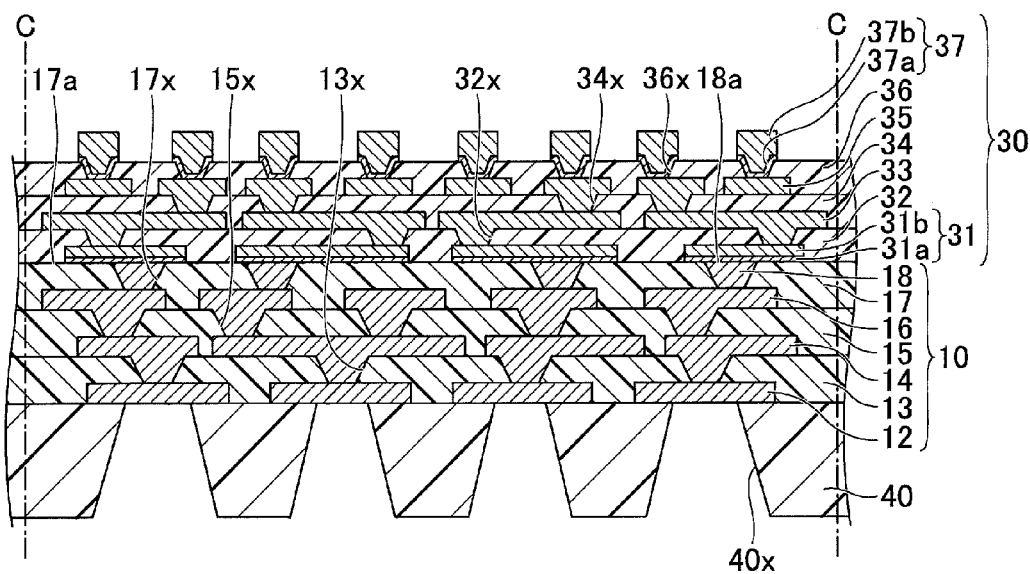

Next, in a step illustrated in FIG. 9B, the solder resist layer 40, which is the outermost insulating layer, is formed on the other surface of the insulating layer 13 of the first wiring component 10 such that to cover the wiring layer 12 of the first wiring component 10. The solder resist layer 40 may be formed by the same method as that of the insulating layer 32 as illustrated in FIG. 6A.

Thereafter, the open portions 40x are formed by the same method for the via holes 32x illustrated in FIG. 6A, for example. A part of the wiring layer 12 of the first wiring component 10 is exposed at a bottom portion of each of the open portions 40x. The wiring layer 12 that exposes at the bottom portion of each of the open portions 40x functions as a pad to be electrically connected to a mounting substrate such as a mother board or the like, for example. The surface treatment layer as described above may be formed at the lower surface of the wiring layer 12 that is exposed at the bottom portion of each of the open portions 40x.

After the step illustrated in FIG. 9B, the structure illustrated in FIG. 9B is cut at cut positions C by a dicer or the like to obtain a plurality of individualized wiring boards 1 (see FIG. 1A).

As such, as each of the insulating layers (insulating layer 13, 15 or 17) that composes the first wiring component 10 includes non-photosensitive resin as a main constituent in the wiring board 1, the thickness of each of the insulating layers can be made thicker compared with the case when each of the insulating layers includes photosensitive resin as a main constituent. Thus, a convexo-concave structure formed by the lower insulating layer and the wiring layer (the insulating layer 15 and the wiring layer 16, for example) can be compensated for, and it is easy to make the upper surface of the insulating layer formed thereon (the upper surface 17a of the insulating layer 17, for example) flat.

Further, by polishing the upper surface 17a of the insulating layer 17, the roughness of the upper surface 17a of the insulating layer 17 can be lowered to about Ra 15 to 40 nm, for example, to improve the smoothness. With this, it is possible to form the high-density wiring layer 31 (wiring pattern) whose line/space is about 2 µm/2 µm, for example, at the upper surface 17a of the insulating layer 17. This means that a high-density wiring layer can be formed.

Further, as the wiring board 1 has a coreless structure without a core layer, the total thickness of the wiring board can be made thinner.

Second Embodiment

In the second embodiment, an example of a wiring board is illustrated in which the structure of the low-density wiring layer is different from that of the first embodiment. In the second embodiment, the components same as those explained above are given the same reference numerals, and explanations are not repeated.
(Structure of Wiring Board of Second Embodiment)

Figure 10A:
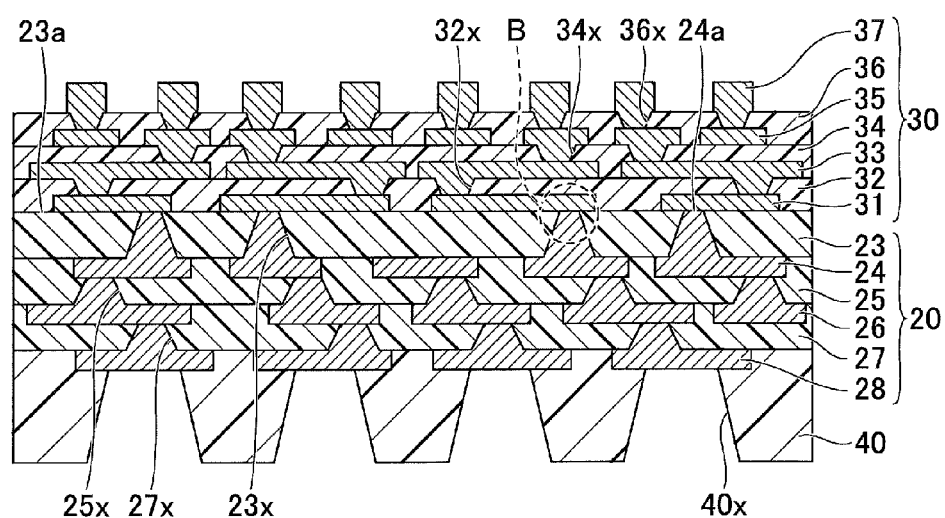
FIG. 10A and FIG. 10B are views illustrating an example of a wiring board of a second embodiment.
Figure 10B:
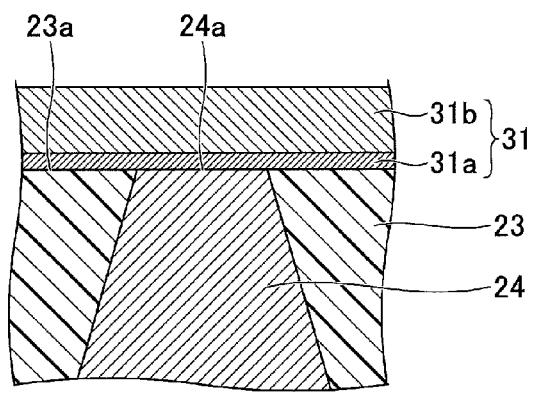

First, a structure of a wiring board of a second embodiment is explained. FIG. 10A and FIG. 10B are views illustrating an example of a wiring board 1A of the second embodiment. FIG. 10B is an enlarged view of a portion "B" in FIG. 10A. With reference to FIG. 10A and FIG. 10B, the wiring board 1A of the second embodiment is different from the wiring board 1 (see FIG. 1A and FIG. 1B) in that the first wiring component 10, which is the low-density wiring layer, is substituted by a first wiring component 20.

The first wiring component 20 includes an insulating layer 23, a wiring layer 24, an insulating layer 25, a wiring layer 26, an insulating layer 27 and a wiring layer 28 stacked in this order at the other surface side of the second wiring component 30. The insulating layers 23, 25 and 27 are a typical example of the first insulating layer. The wiring layers 24 and 26 are a typical example of the first wiring layer. The via wiring that composes the wiring layer 24 is a typical example of the first via wiring.

The insulating layer 23 is formed at the other surface of the second wiring component 30 (the lower surface of the wiring layer 31 and the lower surface of the insulating layer 32). An upper surface 23a of the insulating layer 23 contacts the other surface of the second wiring component 30 (the lower surface of the wiring layer. 31 and the lower surface of the insulating layer 32). The material or the thickness of the insulating layer 23 may be the same as that of the insulating layer 13, for example. The insulating layer 23 may include filler such as silica ($SiO_2$) or the like.

The wiring layer 24 is formed at a lower surface side of the insulating layer 23 and is electrically connected to the wiring layer 31 of the second wiring component 30. The wiring layer 24 includes via wirings respectively filled in via holes 23x that are provided to penetrate the insulating layer 23 to expose the lower surface of the wiring layer 31, and a wiring pattern formed at the other surface of the insulating layer 23. Each of the via holes 23x is a concave portion where the area of an open portion at an insulating layer 25 side is larger than the area of a bottom portion formed at the lower surface of the wiring layer 31. For example, when the open portions of each of the via holes 23x at both sides have circular shapes, respectively, each of the via holes 23x is a concave portion having a cone trapezoid shape. At this time, the diameter of the open portion of the via hole 23x at the insulating layer 25 side may be about 60 to 70 µm, for example. The material of the wiring layer 24 or the thickness or the line/space of the wiring pattern that composes the wiring layer 24 may be the same as that of the wiring layer 14, for example.

With such a shape of the via hole 23x, the area of one end surface 24a (hereinafter, referred to as one end surface 24a of the wiring layer 24) of the via wiring that composes the wiring layer 24 becomes smaller than the area of the other end surface (an end surface at the insulating layer 25 side). However, the via wirings that compose the wiring layer 24 is integrally formed with the wiring pattern that composes the wiring layer 24 (the wiring pattern formed at the other surface of the insulating layer 23). This means that although for the via wiring that composes the wiring layer 24, a portion corresponding to the open portion opened at the insulating layer 25 side of the via hole 23x is referred to as "the other end surface" here, there is no interface between the via wiring and the wiring pattern that compose the wiring layer 24.

The one end surface 24a of the wiring layer 24 is exposed from the upper surface 23a of the insulating layer 23 and has a polished flat surface. The one end surface 24a of the wiring layer 24 may be flush with the upper surface 23a of the insulating layer 23, for example. The one end surface 24a of the wiring layer 24 is directly connected to the wiring layer 31 that composes the second wiring component 30.

For each of the via holes 23x, the diameter of an open portion at the lower surface side of the wiring layer 31 is smaller than the diameter of an open portion at the insulating layer 25 side. Further, for each of the via holes 32x, the diameter of an open portion at the upper surface side of the wiring layer 31 is smaller than the diameter of an open portion at the insulating layer 34 side. This means that each of the via holes 23x and each of the via holes 32x are placed such that a side where the diameter of an open portion is smaller faces each other via the wiring layer 31. In other words, the wiring layers 24 and 33 are formed such that the one end surface 24a of the wiring layer 24 that is exposed from a side of the via hole 23x where the diameter of an open portion is smaller, and a lower end surface of the via wiring of the wiring layer 33 that is exposed from a side of the via hole 32x where the diameter of an open portion is smaller face with each other via the wiring layer 31.

Here, the upper surface 23a of the insulating layer 23 is a surface polished in order to improve its smoothness and the roughness of which is about Ra 15 to 40 nm, for example. This is about 1/10 of the roughness before being polished. Further, the upper surface 23a of the insulating layer 23 is a smooth surface whose roughness is smaller than that of the upper surfaces of the insulating layer 25 and the insulating layer 27, which are made of the same material as the insulating layer 23. By reducing the roughness of the upper surface 23a of the insulating layer 23 and improving its smoothness, it is possible to form the wiring layer 31 that is a fine wiring (high-density wiring pattern) on the upper surface 23a of the insulating layer 23.

As such, in this embodiment, although the wiring layer 24 and the wiring layer 31 are electrically connected with each other, they are not integrally formed. With this configuration, the upper surface 23a of the insulating layer 23 can be made into a smooth surface and thus, it is possible to form a high-density wiring pattern (line/space is about 2 μm/2 μm, for example) on the insulating layer 23 as the wiring layer 31.

Here, when the wiring layer 31 is formed by a semi-additive method in the method of manufacturing, which will be explained later, the wiring layer 31 has a stacked structure of a seed layer 31a and an electrolytic plating layer 31b stacked an the seed layer 31a as illustrated in FIG. 10B. Then, the one end surface 24a of the wiring layer 24, which is the via wiring, is directly connected to the seed layer 31a (a stacked body of a titanium (Ti) layer and a copper (Cu) layer or the like, for example) that composes the wiring layer 31.

The insulating layer 25 is formed at another surface of the insulating layer 23 such that to cover the wiring layer 24. The material or the thickness of the insulating layer 25 may be the same as that of the insulating layer 13, for example. The insulating layer 25 may include filler such as silica ($SiO_2$) or the like.

The wiring layer 26 is formed at another side of the insulating layer 25 and is electrically connected to the wiring layer 24. The wiring layer 26 includes via wirings respectively filled in via holes 25x that are provided to penetrate the insulating layer 25 to expose another surface of the wiring layer 24, and a wiring pattern formed at the other surface of the insulating layer 25. Each of the via holes 25x is a concave portion having a cone trapezoid shape where the diameter of an open portion at an insulating layer 27 side is larger than the diameter of a bottom portion formed at a lower surface of the wiring layer 24. The diameter of the open portion of the via hole 25x at the insulating layer 27 side may be about 60 to 70 μm, for example. The material of the wiring layer 26 or the thickness or the line/space of the wiring pattern that composes the wiring layer 26 may be the same as that of the wiring layer 14, for example.

The insulating layer 27 is formed at another surface of the insulating layer 25 such that to cover the wiring layer 26. The material or the thickness of the insulating layer 27 may be the same as that of the insulating layer 13, for example. The insulating layer 27 may include filler such as silica ($SiO_2$) or the like.

The wiring layer 28 is formed at the other side of the insulating layer 27 and is electrically connected to the wiring layer 26. The wiring layer 28 includes via wirings respectively filled in via holes 27x that are provided to penetrate the insulating layer 27 to expose another surface of the wiring layer 26, and a wiring pattern formed at the other surface of the insulating layer 27. Each of the via holes 27x is a concave portion having a cone trapezoid shape where the diameter of an open portion at a solder resist layer 40 side is larger than the diameter of a bottom portion formed at a lower surface of the wiring layer 26. The diameter of the open portion of the via hole 27x at the solder resist layer 40 side may be about 60 to 70 μm, for example. The material of the wiring layer 28 or the thickness or the line/space of the wiring pattern that composes the wiring layer 28 may be the same as that of the wiring layer 14, for example.

The solder resist layer 40 is an outermost insulating layer formed at a lower surface of the insulating layer 27 of the first wiring component 20 such that to selectively expose the wiring layer 28 of the first wiring component 20. For the material of the solder resist layer 40, photosensitive insulating resin (thermosetting, for example) including phenol-based resin, polyimide-based resin or the like as a main constituent may be used, for example. The solder resist layer 40 may include filler such as silica ($SiO_2$) or the like.

The solder resist layer 40 is provided with open portions 40x and a part of the wiring layer 28 of the first wiring component 20 is exposed at a bottom portion of each of the open portions 40x. The wiring layer 28 that is exposed at the bottom portion of each of the open portions 40x functions as a pad that is to be electrically connected to a mounting substrate such as a mother board or the like, for example. Here, the surface treatment layer as described above may be formed at the lower surface of the wiring layer 28 that is exposed at the bottom portion of each of the open portions 40x.

(Method of Manufacturing Wiring Board of Second Embodiment)

Next, a method of manufacturing the wiring board 1A of the second embodiment is explained. FIG. 11A to FIG. 12B are views illustrating an example of manufacturing steps of the wiring board 1A of the second embodiment. Although an example of a manufacturing step in which a part corresponding to a plurality of wiring boards is firstly manufactured and then, the plurality of wiring boards are obtained by individualizing the part in this embodiment, a manufacturing step in which each single wiring board is manufactured may be alternatively used.

Figure 11A:
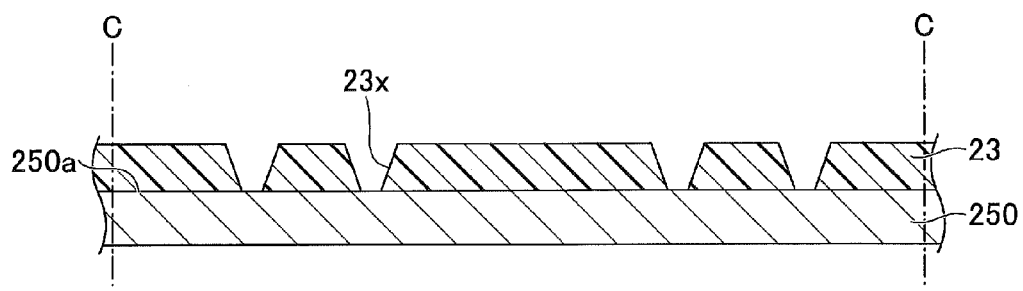
FIG. 11A to FIG. 11C are views illustrating an example of manufacturing steps of the wiring board of the second embodiment.

First, in a step illustrated in FIG. 11A, the support body 250 same as that explained above with reference to FIG. 2A is prepared, and the insulating layer 23 is formed on the one surface 250a of the support body 250. Then, the via holes 23x that penetrate the insulating layer 23 to expose the one surface 250a of the support body 250 are formed in the insulating layer 23. The method of forming the insulating layer 23 and the via holes 23x may be the same as the steps explained above with reference to FIG. 2C and FIG. 3A.

Figure 11B:
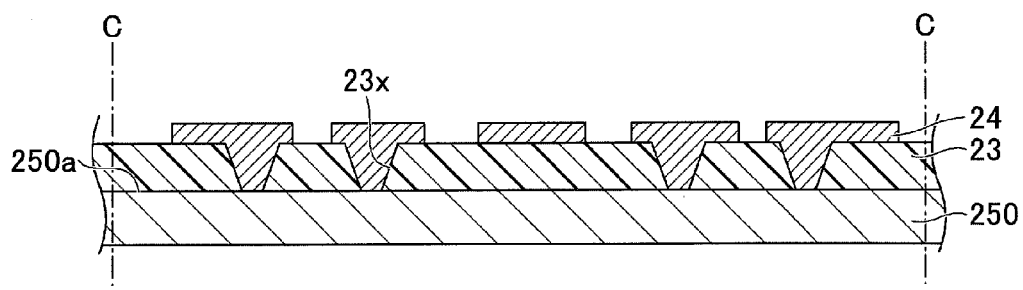

Next, in a step illustrated in FIG. 11B, the wiring layer 24 is formed on the insulating layer 23. Specifically, first, a resist layer (not illustrated in the drawings) provided with open portions corresponding to the wiring layer 24 is formed on the one surface 250a of the support body 250. The method of forming the resist layer and the open portions may be the same as the step explained above with reference to FIG. 2A, for example. Then, the wiring layer 24 including the via wirings filled in the via holes 23x and the wiring pattern formed on the insulating layer 23 is formed by electroplating or the like using the support body 250 as a power supply layer and depositing copper or the like in the open portions of the resist layer. After forming the wiring layer 24, the resist layer is removed.

Figure 11C:
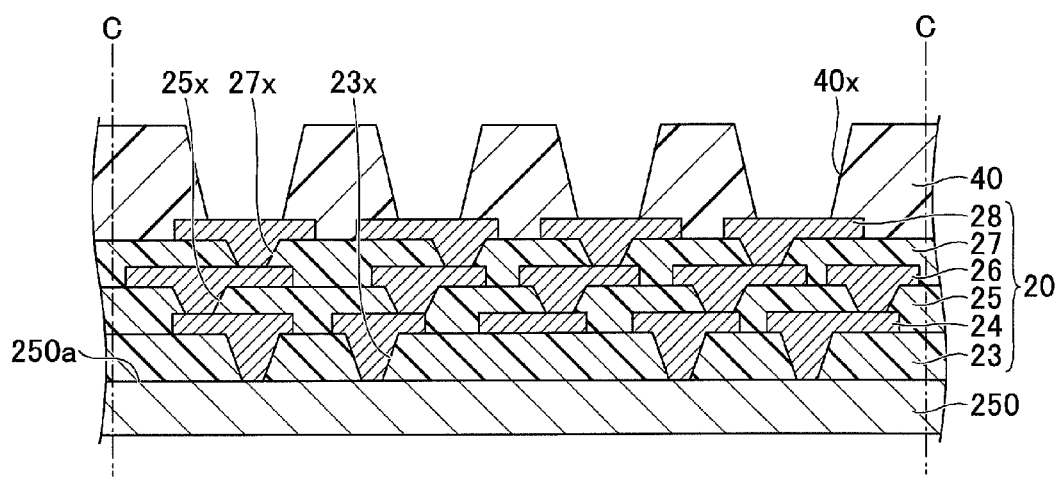

Next, in a step illustrated in FIG. 11C, similar to the step explained above with reference to FIG. 3C, the insulating layer 25, the wiring layer 26, the insulating layer 27 and the wiring layer. 2B are stacked in this order on the insulating layer 23 and the wiring layer 24 to form the first wiring component 20. Specifically, after forming the insulating layer 25 that covers the wiring layer 24 on the insulating layer 23, the via holes 25x that penetrate the insulating layer 25 to expose the upper surface of the wiring layer 24 are formed. Then, the wiring layer 26 that is connected to the wiring layer 24 is formed in the via holes 25x and on the insulating layer 25. The wiring layer 26 includes the via wirings filled in the via holes 25x and the wiring pattern formed on the insulating layer 25. The wiring layer 26 is electrically connected to the wiring layer 24 that is exposed at the bottom portion of each of the via holes 25x. The wiring layer 26 may be formed by a semi-additive method, for example.

Further, after forming the insulating layer 27 that covers the wiring layer 26 on the insulating layer 25, the via holes 27x that penetrate the insulating layer 27 to expose the upper surface of the wiring layer 26 are formed. Further, the wiring layer 28 that is connected to the wiring layer 26 is formed in the via holes 27x and on the insulating layer 27. The wiring layer 28 includes the via wirings filled in the via holes 27x and the wiring pattern formed on the insulating layer 27. The wiring layer 28 is electrically connected to the wiring layer 26 that is exposed at the bottom portion of each of the via holes 27x. The wiring layer 28 may be formed by a semi-additive method, for example.

Then, similar to the step explained above with reference to FIG. 9B, the solder resist layer 40 provided with the open portions 40x that selectively expose the wiring layer 28 of the first wiring component 20 is formed on the first wiring component 20.

Figure 12A:
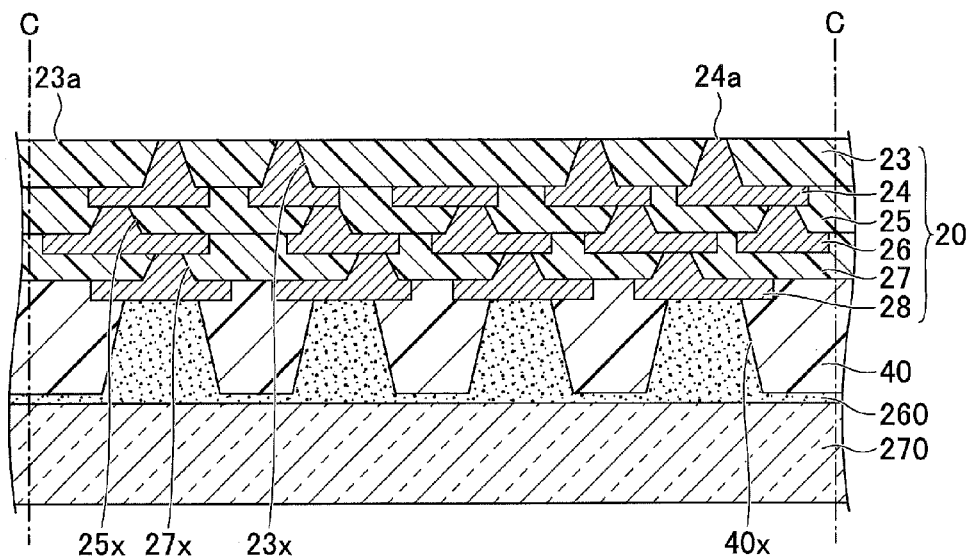
FIG. 12A and FIG. 12B are views illustrating an example of manufacturing steps of the wiring board of the second embodiment.

Next, in a step illustrated in FIG. 12A, the structure illustrated in FIG. 11C is reversed up-side down. Then, similar to the step as described above with reference to FIG. 4B, the reinforcing substrate 270 is adhered to the lower surface side of the solder resist layer 40 via the adhesion layer 260. Then, the support body 250 is removed. When removing the support body 250, first, the support body 250 is thinned by half-etching using ferric chloride aqueous solution or the like. At this time, the upper surface 23a of the insulating layer 23 and the one end surface 24a of the wiring layer 24 are not exposed from the support body 250. Next, the thinned support body 250 is removed by polishing using CMP or the like to expose the upper surface 23a of the insulating layer 23 and the one end surface 24a of the wiring layer 24. At this time, parts of the upper surface 23a of the insulating layer 23 and the one end surface 24a of the wiring layer 24 may be removed at the same time. The upper surface 23a of the insulating layer 23 and the one end surface 24a of the wiring layer 24 may be removed for about 3 to 5 μm, for example.

By polishing the upper surface 23a of the insulating layer 23 and removing the part of the upper surface 23a of the insulating layer 23, roughness of the upper surface 23a of the insulating layer 23 can be made smaller compared with that of before polishing. This means that smoothness of the upper surface 23a of the insulating layer 23 can be improved. The roughness of the upper surface 23a of the insulating layer 23 before performing CMP may be about Ra 300 to 400 nm, and the roughness of the upper surface 23a of the insulating layer 23 can be about Ra 15 to 40 nm by performing CMP, for example. As such, by reducing the roughness of the upper surface 23a of the insulating layer 23 to improve the smoothness, fine wirings (high-density wiring pattern) can be formed in the subsequent process.

Figure 12B:
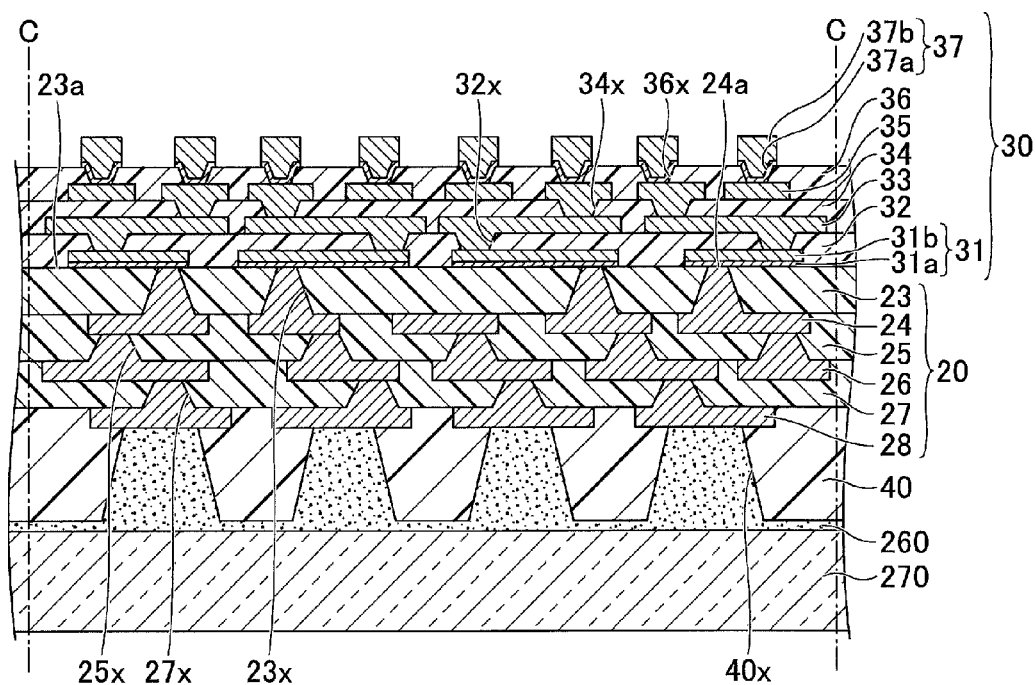

Next, in a step illustrated in FIG. 12B, similar to the steps described above with reference to FIG. 4B to FIG. 8B, the second wiring component 30 that is the high-density wiring layer is formed on the upper surface 23a of the insulating layer 23. Thereafter, similar to the step explained above with reference to FIG. 9A, the adhesion layer 260 and the reinforcing substrate 270 are removed, and the structure is cut at cut positions C by a dicer or the like to obtain a plurality of individualized wiring boards 1A (see FIG. 10A).

As such, in the wiring board 1A, similar to the wiring board 1, by polishing the upper surface 23a of the insulating layer 23, the roughness of the upper surface 23a of the insulating layer 23 can be lowered to about Ra 15 to 40 nm, for example, to improve the smoothness. With this, it is possible to form the high-density wiring layer 31 (wiring pattern) whose line/space is about 2 μm/2 μm, for example, at the upper surface 23a of the insulating layer 23. This means that a high-density wiring layer can be formed.

Further, as the wiring board 1A has a coreless structure without a core layer, the total thickness of the wiring board can be made thinner.

Alternative Example of First Embodiment

In an alternative example of the first embodiment, an example of a wiring board is illustrated in which the shape of a pad for mounting an electronic component is different. In the alternative example of the first embodiment, the components same as those explained above are given the same reference numerals, and explanations are not repeated.

Figure 13:
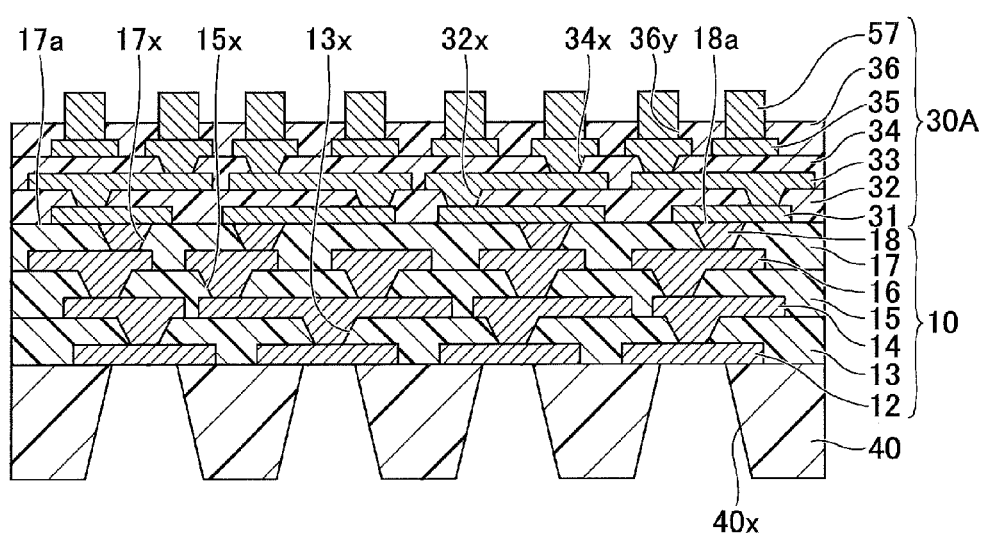
FIG. 13 is a cross-sectional view illustrating an example of a wiring board of an alternative example of the first embodiment.

FIG. 13 is a cross-sectional view illustrating an example of a wiring board 1B of the alternative example of the first embodiment. With reference to FIG. 13, the wiring board 1B of the alternative example of the first embodiment is different from the wiring board 1 (see FIG. 1A) in that the second wiring component 30 is substituted by a second wiring component 30A. In the second wiring component 30A, instead of the via holes 36x of the second wiring component 30, via holes 36y are formed and instead of the wiring layer 37, a wiring layer 57 is provided.

The wiring layer 57 is formed at the one side of the insulating layer 36. The wiring layer 57 includes via wirings respectively filled in via holes 36y that are provided to penetrate the insulating layer 36 to expose the one surface of the wiring layer 35, and pads projected from the one surface of the insulating layer 36. The via hole 36y is formed as a cylindrical concave portion. The diameter of the open portion of the via hole 36y may be about 20 to 30 μm, for example.

The material of the wiring layer 57 may be the same as that of the wiring layer 37, for example. The thickness of the wiring layer 57 (including a pad portion that projects from the one surface of the insulating layer 36) may be about 10 μm, for example. The wiring layer 57 may have a cylindrical shape with a diameter of about 20 to 30 μm, for example. This means that the diameter of the via wiring and the diameter of the pad portion may be the same, and may be about 20 to 30 μm, for example. The pitch of the wiring layer 57 may be about 40 to 50 μm, for example. Each of the pads that composes the wiring layer 57 functions as a pad for mounting an electronic component such as a semiconductor chip or the like that is to be electrically connected to the electronic component, for example. Here, the surface treatment layer (not illustrated in the drawings) as described above may be formed at the surface (an upper surface and a side surface, or only the upper surface) of each of the pads that composes the wiring layer 57.

The wiring layer 57 may be formed by the following steps. FIG. 14A to FIG. 15B are views illustrating an example of manufacturing steps of the wiring board 1B of the alternative example of the first embodiment. Although an example of a manufacturing step in which a part corresponding to a plurality of wiring boards is firstly manufactured and then, the plurality of wiring boards are obtained by individualizing the part in this embodiment, a manufacturing step in which each single wiring board is manufactured may be alternatively used.

Figure 14A:
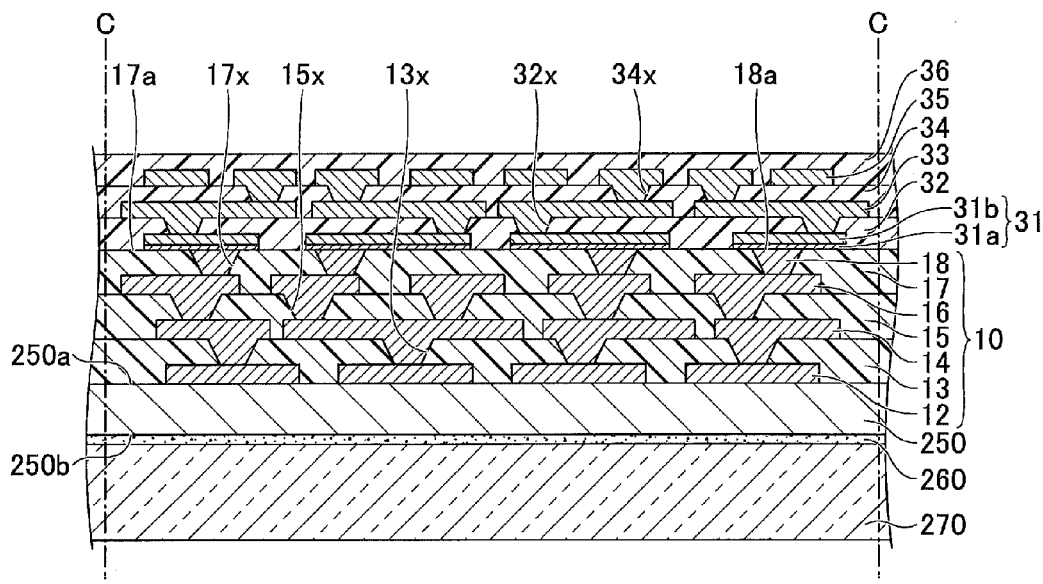
FIG. 14A and FIG. 14B are views illustrating an example of manufacturing steps of the wiring board of the alternative example of the first embodiment.
Figure 14B:
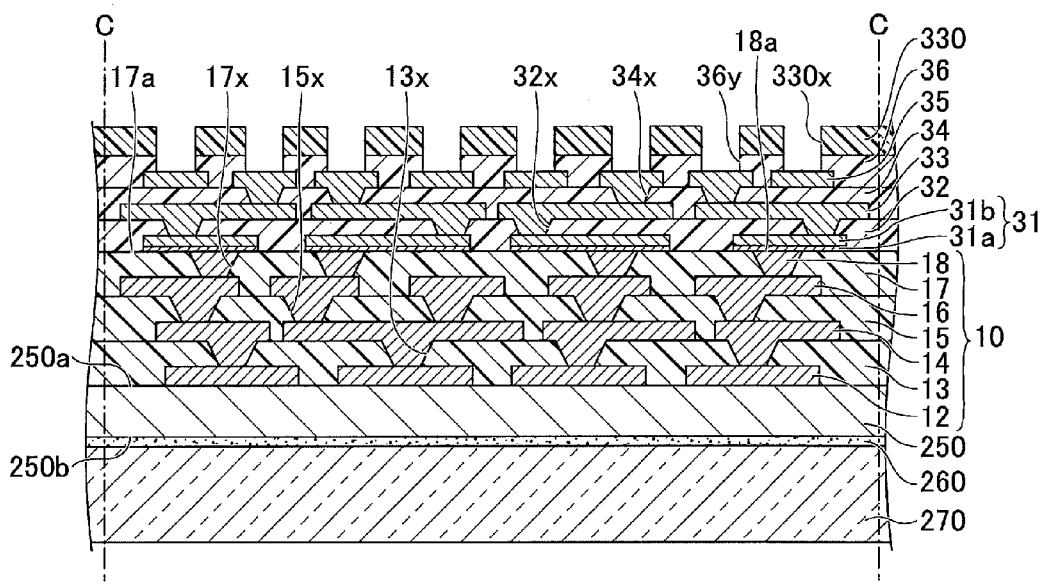

First, in a step illustrated in FIG. 14A, similar to the steps as described above with reference to FIG. 2A to FIG. 6B in the first embodiment, the structure is formed in which the insulating layer 36 is formed as an uppermost layer. Next, in a step illustrated in FIG. 14B, a photosensitive resist layer 330 is formed on the upper surface of the insulating layer 36, and the open portions 330x are formed by exposing and developing. Next, the insulating layer 36 that is exposed in each of the open portions 330x is removed by dry etching or the like to form via holes 36y that are in communication with the open portions 330x, respectively. At this time, the upper surface of the wiring layer 35 is exposed at the bottom portion of each of the via holes 36y. Each of the via holes 36y and the open portions 330x may have a cylindrical shape with a diameter of about 20 to 30 µm, for example. The pitch of the via holes 36y and the open portions 330x may be about 40 to 50 µm, for example.

Figure 15A:
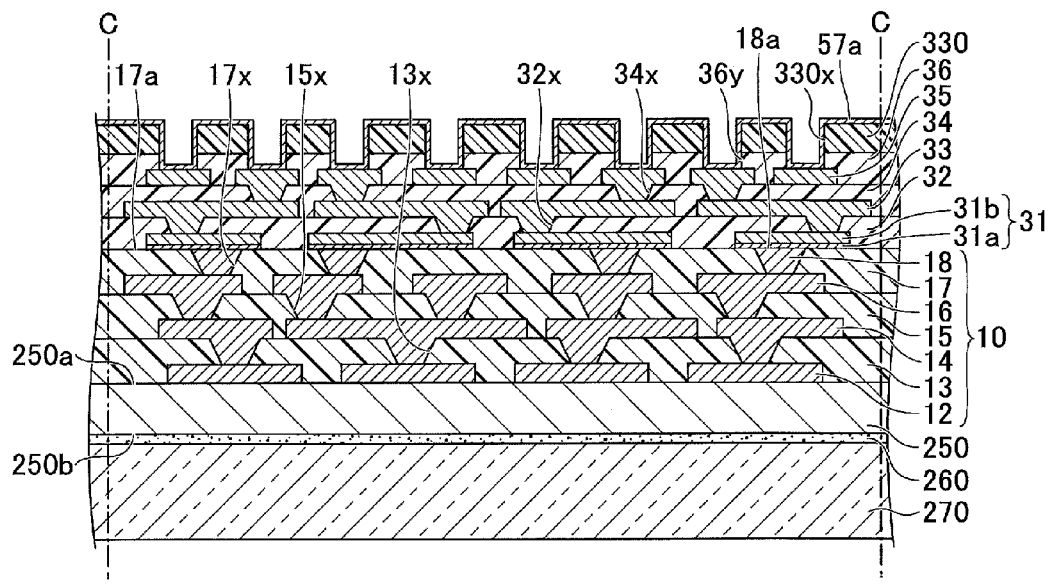
FIG. 15A and FIG. 15B are views illustrating an example of manufacturing steps of the wiring board of the alternative example of the first embodiment.

Next, in a step illustrated in FIG. 15A, a seed layer 57a that continuously covers the upper surface of the wiring layer 35 exposed at the bottom portion of each of the via holes 36y, the inner wall surface of each of the via holes 36y, the inner wall surface of each of the open portions 330x and the upper surface of the resist layer 330 is formed, for example. The seed layer 57a may be formed by electroless plating, sputtering or the like, for example. The material or the thickness of the seed layer 57a may be the same as that of the seed layer 37a, for example.

Figure 15B:
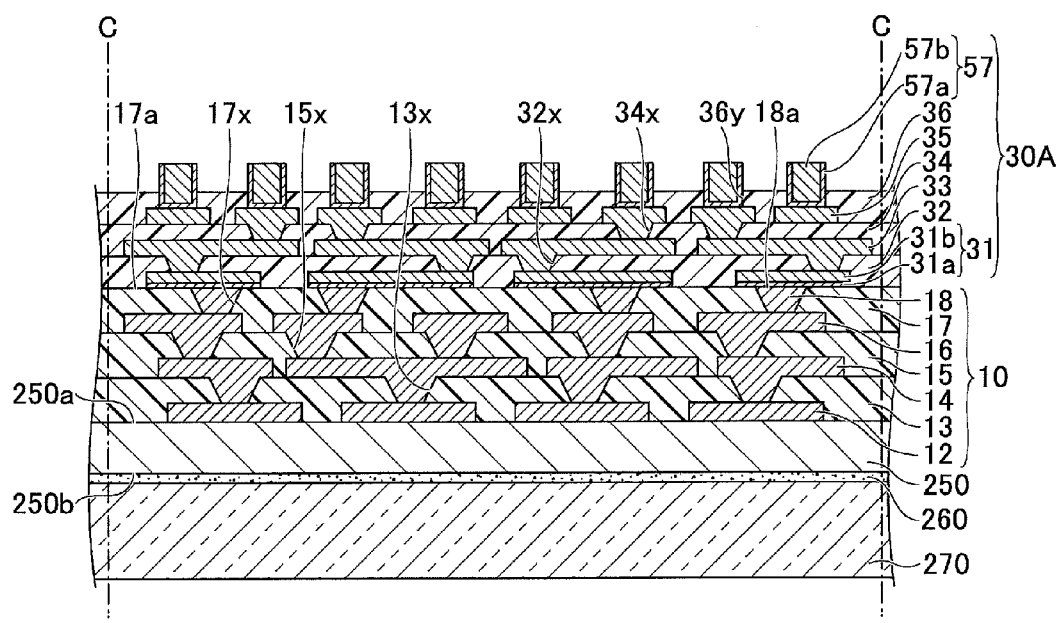

Next, in a step illustrated in FIG. 15B, after forming the wiring layer 57 including the seed layer 57a and the electrolytic plating layer 57b in each of the via holes 36y and each of the open portions 330x, the resist layer 330 is removed. Specifically, another resist layer (not illustrated in the drawings) provided with open portions corresponding to the wiring layer 57 is formed on the seed layer 57a that is formed on the upper surface of the resist layer 330. Then, the electrolytic plating layer 57b made of copper (Cu) or the like is formed in each of the open portions of the other resist layer by electroplating using the seed layer 57a as a power supply layer.

Subsequently, by removing the other resist layer, the wiring layer 57 in which the electrolytic plating layer 57b is stacked on the seed layer 57a is formed. The wiring layer 57 may have a cylindrical shape with a diameter of about 20 to 30 µm, for example. This means that the diameter of the via wiring and the diameter of the pad portion may be the same and may be about 20 to 30 µm, for example.

As such, in the alternative example of the first embodiment, the cylindrical wiring layer 57 in which the diameter of the via wiring and the diameter of the pad portion are the same is formed. With this configuration, in addition to the advantages of the first embodiment, the following advantages are provided. That is, as the area of the wiring layer 57 that contacts and that is connected to the wiring layer 35 is larger compared with that of the wiring layer 37 of the wiring board 1 (see FIG. 1A), reliability in connection with the wiring layer 35 can be improved.

Further, for the wiring layer 57, different from the wiring layer 37, the side surface of the pad is covered by a seed layer 57a including titanium (Ti), titanium nitride (TiN) or the like that is metal with a higher corrosion resistance than copper. This can work for antioxidation or preventing migration of the wiring layer 57.

Further, the second embodiment may be changed similar to the alternative example of the first embodiment.

Application Example 1 of First Embodiment

In an application example 1 of the first embodiment, an example of a semiconductor package is illustrated in which a semiconductor chip is mounted (flip-chip mounted) on the wiring board of the first embodiment. In the application example 1 of the first embodiment, the components same as those explained above are given the same reference numerals, and explanations are not repeated.

Figure 16:
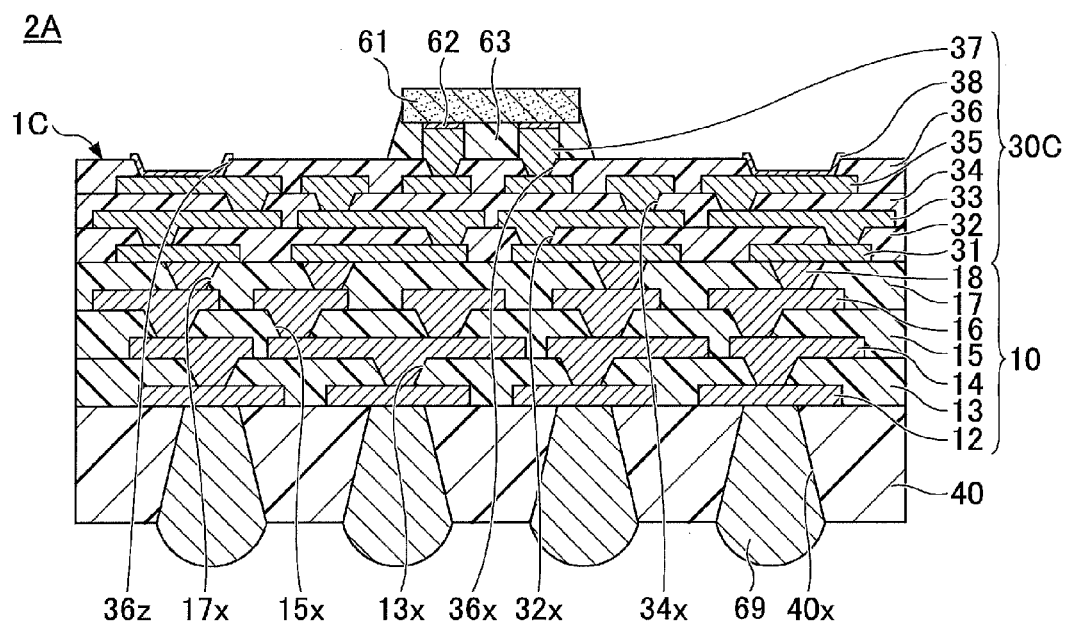
FIG. 16 is a cross-sectional view illustrating an example of a semiconductor package of an application example 1 of the first embodiment.

FIG. 16 is a cross-sectional view illustrating an example of a semiconductor package 2A of the application example 1 of the first embodiment. With reference to FIG. 16, the semiconductor package 2A includes a wiring board 1C, a semiconductor chip 61, bumps 62, underfill resin 63 and bumps 69.

The wiring board 1C basically has a structure same as that of the wiring board 1 illustrated in FIG. 1A, however, the second wiring component 30 is substituted by a second wiring component 30C. The second wiring component 30C is different from the second wiring component 30 (see FIG. 1A) in that the insulating layer 36 is provided with open portions 36z that selectively expose the upper surface of the wiring layer 35 and a wiring layer 38 is provided in each of the open portions 36z. Further, portions of the wiring layer 37 that become pads are provided at positions corresponding to the semiconductor chip 61 to be mounted.

The wiring layer 38 has a concave shape that is formed on the upper surface of the wiring layer 35 exposed in each of the open portions 36z, formed at a side surface of each of the open portions 36z and further formed at the upper surface of the insulating layer 36 around each of the open portions 36z. The wiring layer 38 is peripherally placed around an area where the semiconductor chip 61 is mounted, for example. The plan shape of the wiring layer 38 may be a circular shape with a diameter of about 120 to 170 µm, for example. If necessary, the surface treatment layer as described above may be formed at a surface of the wiring layer 38.

The wiring layer 38 is provided as pads for connecting the wiring board 1C to another wiring board or a semiconductor package. Thus, in a case when only the semiconductor chip 61 is mounted on the wiring board 1C and it is unnecessary to connect the wiring board 1C to another wiring board or the like at a semiconductor chip 61 side, the open portions 36z and the wiring layer 38 may not be provided.

The semiconductor chip 61 has a structure in which a semiconductor integrated circuit or the like (not illustrated in the drawings) is formed on a thinned semiconductor substrate (not illustrated in the drawings) made of silicon or the like, for example. In the semiconductor substrate (not illustrated in the drawings), electrode pads (not illustrated in the drawings) that are electrically connected to the semiconductor integrated circuit (not illustrated in the drawings) are formed.

The bumps 62 electrically connect the electrode pads (not illustrated in the drawings) of the semiconductor chip 61 and the wiring layer 37 of the wiring board 1C. The underfill resin 63 is filled between the semiconductor chip 61 and the upper surface of the wiring board 1C. The bumps 69 are formed at the lower surface of the wiring layer 12 that is exposed at a bottom portion of each of the open portions 40x of the solder resist layer 40. The bumps 69 are connected to a mounting substrate such as a mother board or the like, for example. The bumps 62 and 69 may be solder bumps, for example. For the material of the solder bump, alloy including Pb, alloy of Sn and Cu, alloy of Sn and Ag, alloy of Sn, Ag and Cu or the like may be used, for example.

As such, by mounting the semiconductor chip on the wiring board of the first embodiment, a semiconductor package can be formed. Here, the wiring board 1C may be changed as the alternative example of the first embodiment or the second embodiment.

Application Example 2 of First Embodiment

In the application example 2 of the first embodiment, an example of a semiconductor package having a Package On Package (POP) structure is illustrated in which another semiconductor package is further mounted on the semiconductor package 61 of the application example 1 of the first embodiment. In the application example 2 of the first embodiment, the components same as those explained above are given the same reference numerals, and explanations are not repeated.

Figure 17:
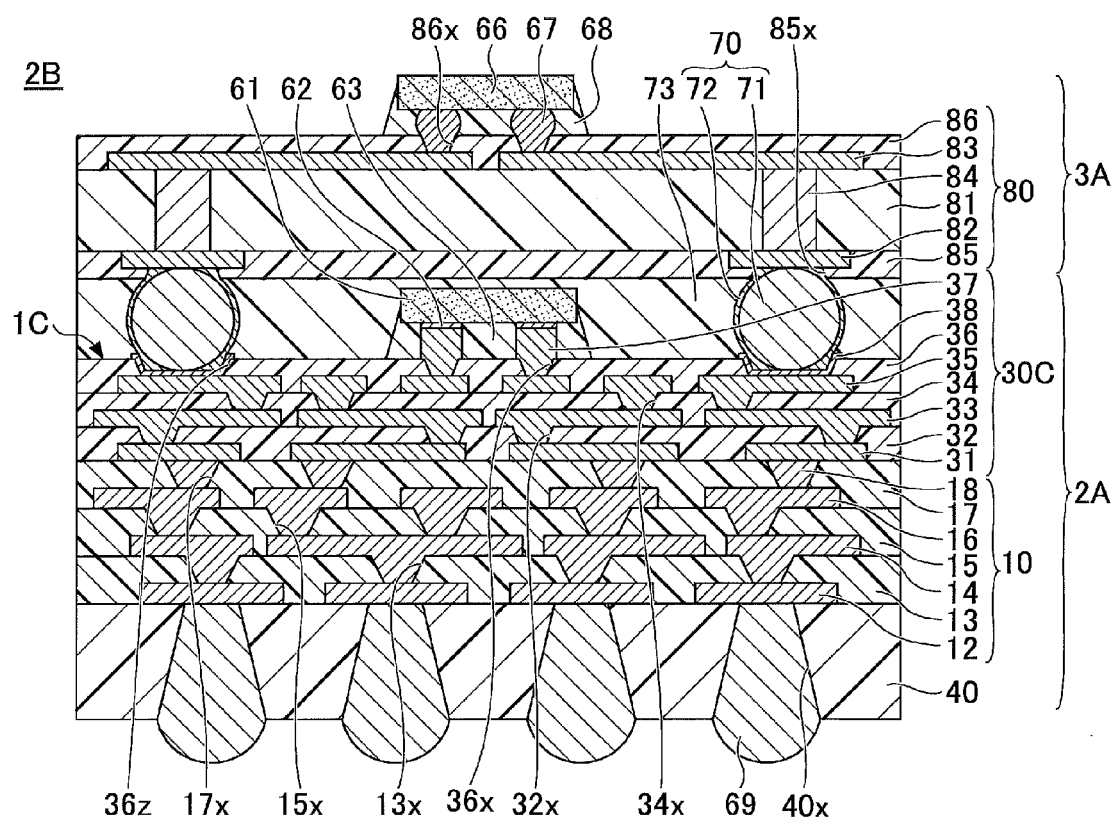
FIG. 17 is a cross-sectional view illustrating an example of a semiconductor package of an application example 2 of the first embodiment.

FIG. 17 is a cross-sectional view illustrating an example of a semiconductor package 2B of the application example 2 of the first embodiment. With reference to FIG. 17, in the semiconductor package 2B, another semiconductor package 3A is further mounted on the semiconductor package 2A of the application example 1 of the first embodiment. The semiconductor package 3A includes a wiring board 80, a semiconductor chip 66, bumps 67 and underfill resin 68.

The wiring board 80 includes a core layer 81, and a wiring layer 82 and a solder resist layer 85, provided with open portions 85x that selectively expose the wiring layer 82 as pads, formed at a lower surface of the core layer 81 in this order. The wiring board 80 further includes a wiring layer 83 and a solder resist layer 86, provided with open portions 86x that selectively expose the wiring layer 83 as pads, formed at an upper surface of the core layer 81 in this order. The wiring layer 82 and the wiring layer 83 are connected via through wirings 84 that penetrate the core layer 81. If necessary, the surface treatment layer as described above may be formed on surfaces of the wiring layer 82 that is exposed in each of the open portions 85x and the wiring layer 83 that is exposed in each of the open portions 86x. Further, another wiring layer may be provided in the core layer 81.

Electrode pads (not illustrated in the drawings) of the semiconductor chip 66 are electrically connected to the wiring layer 83 (pad) that is exposed in each of the open portions 86x of the wiring board 80 via the bumps 67 that are solder bumps or the like. The underfill resin 68 is filled between the semiconductor chip 66 and an upper surface of the wiring board 80. The semiconductor chip 66 may have a same function as the semiconductor chip 61 or may have a different function from the semiconductor chip 61.

The wiring layer 82 (pad) that is exposed in each of the open portions 85x is formed to face the wiring layer 38 (pad) of the semiconductor package 2A, and may have substantially the same shape as the wiring layer 38 (pad). The wiring layer 82 (pad) and the wiring layer 38 (pad) are connected via solder balls 70 in each of which a periphery of a copper core ball 71 is covered by solder 72.

The solder balls 70 function as a spacer that retains the distance between the semiconductor package 2A and the semiconductor package 3A at a predetermined distance in addition to functioning as binders that bond the semiconductor package 2A and the semiconductor package 3A. This means that the solder 72 functions as the binders and the copper core ball 71 functions as the spacer. The height of the solder ball 70 is set to be higher than the total thickness of the semiconductor chip 61, the bump 62 and the projected portion of the wiring layer 37 projected from the wiring board 1C.

Sealing resin 73 is filled in a space between the semiconductor package 2A and the semiconductor package 3A. The semiconductor package 2A is fixed to the semiconductor package 3A and the semiconductor chip 61 mounted on the wiring board 1C is sealed by the sealing resin 73. This means that the sealing resin 73 functions as an adhesive agent that adheres the semiconductor package 2A and the semiconductor package 3A and also functions as a protective layer that protects the semiconductor chip 61. Further, by providing the sealing resin 73, mechanical strength of the entirety of the semiconductor package 2B can be increased.

Figure 18:
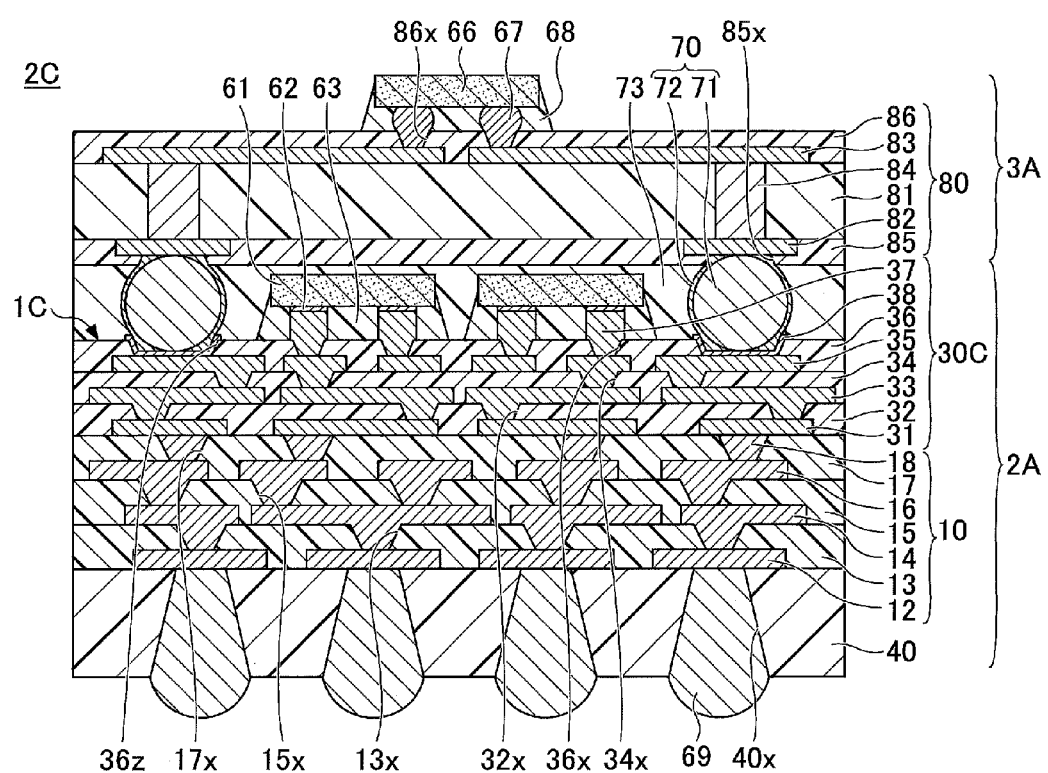
FIG. 18 is a cross-sectional view illustrating another example of the semiconductor package of the application example 2 of the first embodiment.

Here, as a semiconductor package 2C illustrated in FIG. 18, a plurality of the semiconductor chips 61 may be mounted on the wiring board 1C. In such a case, combination of a logic chip and a memory chip may be mounted on the wiring board 1C, for example. Alternatively, a CPU chip and a DRAM chip may be mounted on the wiring board 1C, or a GPU chip and a DRAM chip may be mounted on the wiring board 1C.

Figure 19:
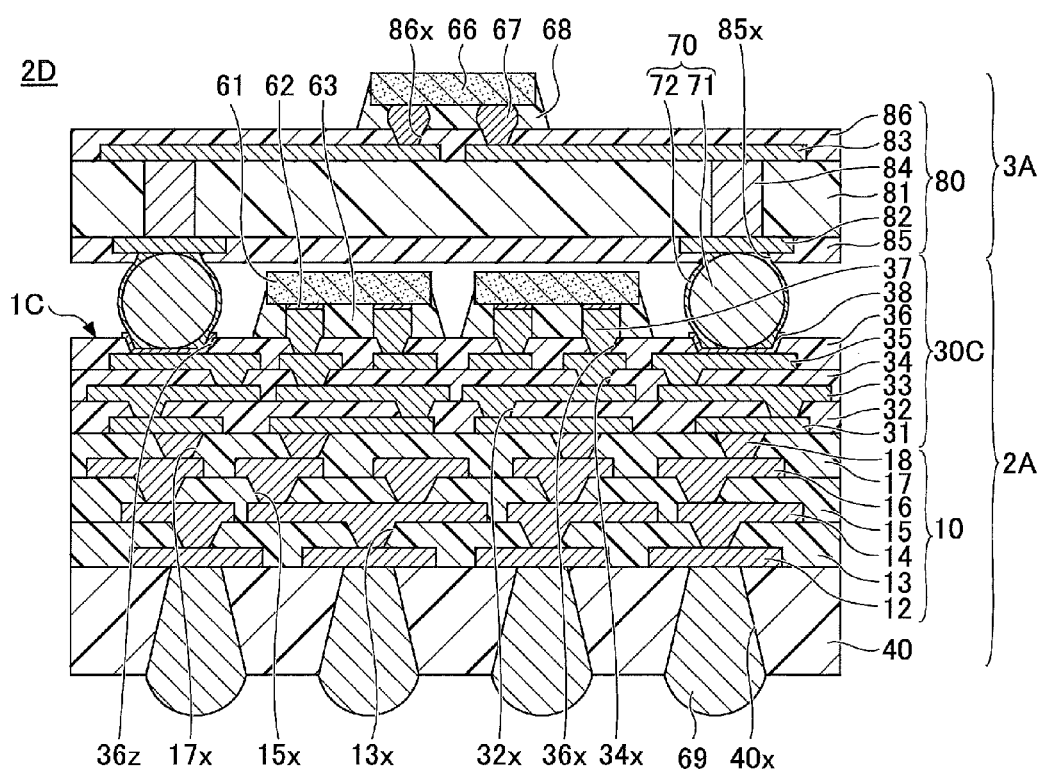
FIG. 19 is a cross-sectional view illustrating another example of the semiconductor package of the application example 2 of the first embodiment.
Figure 20:
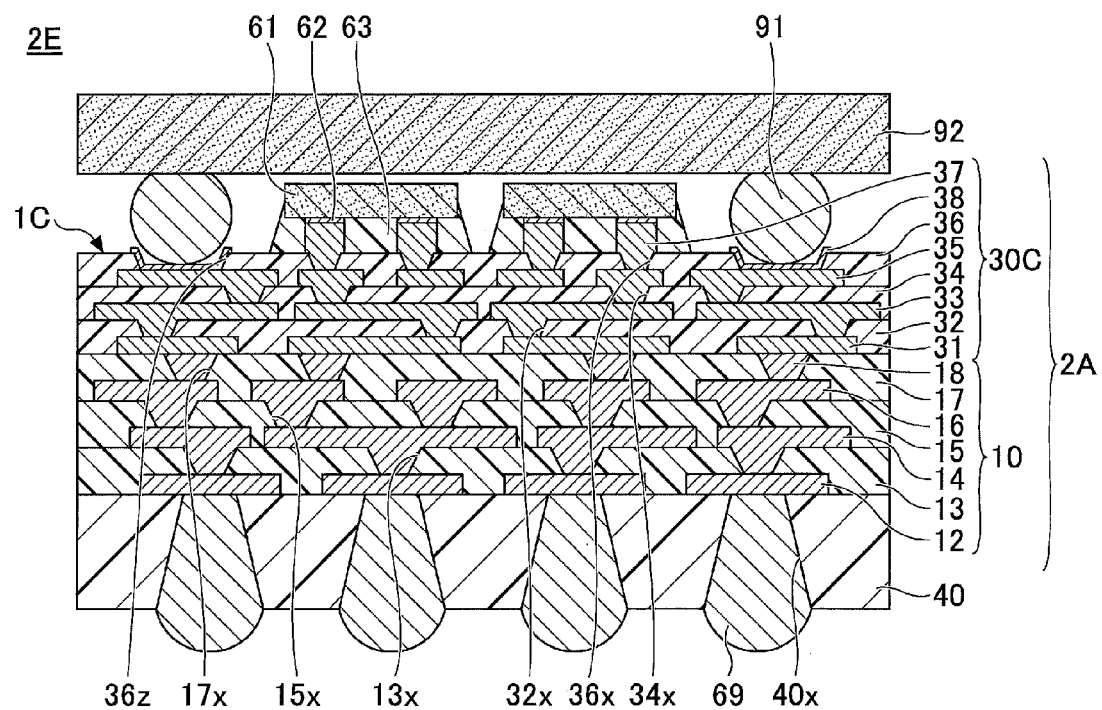
FIG. 20 is a cross-sectional view illustrating another example of the semiconductor package of the application example 2 of the first embodiment.

Further, as a semiconductor package 2D illustrated in FIG. 19, the sealing resin 73 may be omitted. Further, as a semiconductor package 2E illustrated in the FIG. 20, another semiconductor chip 92 that is different from the semiconductor chip 61 may be mounted on the semiconductor package 2A via bumps 91. For the semiconductor chip 92, a logic chip such as a CPU, a GPU or the like, a memory chip such as a DRAM chip, a SRAM chip or the like may be used. Further, for the bump 91, a gold bump, a solder bump or the like may be used, for example.

As such, another semiconductor chip, another semiconductor package or the like may be mounted on the semiconductor package of the application example 1 of the first embodiment. Further, the wiring board 1C may be changed as the alternative example of the first embodiment or the second embodiment.

According to the embodiment, a wiring board in which a high-density wiring layer is actualized can be provided.

Although a preferred embodiment of the wiring board has been specifically illustrated and described, it is to be understood that minor modifications may be made therein without departing from the spirit and scope of the invention as defined by the claims.

The present invention is not limited to the specifically disclosed embodiments, and numerous variations and modifications may be made without departing from the spirit and scope of the present invention.

For example, for the entirety of or a part of the insulating layers that compose the low-density wiring layers in each of the embodiments, an insulating layer that is obtained by immersing insulating resin such as epoxy-based resin or the like in a glass cloth may be used.

What is claimed is:

1. A wiring board comprising:
   a plurality of first insulating layers;
   a plurality of first wiring layers alternately formed in the plurality of first insulating layers;
   a plurality of first via wirings formed by filling metal in via holes formed in the plurality of first insulating layers, respectively;
   a plurality of second insulating layers formed on a first surface of an uppermost first insulating layer of the plurality of first insulating layers;
   a plurality of second wiring layers alternately formed in the plurality of second insulating layers at the first surface of the uppermost first insulating layer;
   a plurality of second via wirings formed by filling metal in via holes in the plurality of second insulating layers, respectively; and
   a solder resist layer formed on a second surface of a lowermost first insulating layer of the plurality of first insulating layers,
   wherein the plurality of first insulating layers are composed of non-photosensitive resin,
   wherein the plurality of second insulating layers, and the solder resist layer are composed of photosensitive resin, respectively, wherein a lowermost second wiring layer has a stacked structure of a seed layer and an electrolytic plating layer stacked on the seed layer, the seed layer being a stacked body of two different metals, wherein a first end surface of an uppermost first via wiring of the plurality of first via wirings embedded in the uppermost first insulating layer is exposed from the first surface of the uppermost first insulating layer and is directly connected to the seed layer of the lowermost second wiring layer, the lowermost second wiring layer in the plurality of second wiring layers being formed on the first surface of the uppermost first insulating layer and the first end surface of the uppermost first via wiring, wherein the first surface of the uppermost first insulating layer and the first end surface of the uppermost first via wiring are polished surfaces, wherein the first end surface of the uppermost first via wiring is flush with the first surface of the uppermost first insulating layer, and wherein the wiring density of the plurality of second wiring layers is higher than the wiring density of the plurality of first wiring layers, wherein the roughness of the first surface of the uppermost first insulating layer, on which the lowermost second wiring layer is directly formed, is smaller than the roughness of a surface of another first insulating layer of the plurality of first insulating layers on which one of the first wiring layers is directly formed, wherein the wiring board is a coreless substrate, wherein the thickness of the lowermost second wiring layer is thinner than that of an uppermost first wiring layer, and wherein the thickness a lowermost second insulating layer is thinner than the thickness of the uppermost first insulating layer.

2. The wiring board according to claim 1,
wherein the uppermost first via wiring is formed such that the area at the first end surface of the uppermost first via wiring is larger than the area at a second end surface of the uppermost first via wiring, and
wherein the second end surface of the uppermost first via wiring is directly connected to the first wiring layer that is formed between the uppermost first insulating layer and another first insulating layer adjacent to the uppermost first insulating layer.

3. The wiring board according to claim 1,
wherein the uppermost first via wiring is formed such that the area at the first end surface of the uppermost first via wiring is smaller than the area at a second end surface of the uppermost first via wiring, and
wherein the second end surface of the uppermost first via wiring is directly connected to the first wiring layer that is formed between the uppermost first insulating layer and another first insulating layer adjacent to the uppermost first insulating layer.

4. The wiring board according to claim 1,
wherein each of the first insulating layers includes filler, and
wherein each of the second insulating layers includes an amount of filler less than an amount of filler of each of the first insulating layers, or each of the second insulating layers does not include filler.

5. The wiring board according to claim 1,
wherein a wiring width and a wiring space of each of the second wiring layers are smaller than a wiring width and a wiring space of each of the first wiring layers.

6. The wiring board according to claim 1,
wherein roughness of the first surface of the uppermost first insulating layer is Ra 15 to 40 nm, and
wherein roughness of a first surface of another first insulating layer of the plurality of first insulating layers on which the first wiring layer is formed is Ra 300 to 400 nm.

7. The wiring board according to claim 1,
wherein an interface exists between the uppermost first via wiring and the lowermost second wiring layer,
wherein at least the first wiring layer formed below and contacting the uppermost first via wiring is integrally formed with another first via wiring of the plurality of first via wirings that is formed below the respective first wiring layer, and
wherein at least the second via wiring formed above and contacting the lowermost second wiring layer is integrally formed with another second wiring layer of the plurality of second wiring layers that is formed above the respective second via wiring.

8. The wiring board according to claim 1,
wherein the seed layer being a stacked body of titanium and copper.

9. A wiring board comprising:
a plurality of first insulating layers;
a plurality of first wiring layers alternately formed in the plurality of first insulating layers;
a plurality of first via wirings formed by filling metal in via holes formed in the plurality of first insulating layers, respectively;
a plurality of second insulating layers formed on a first surface of an uppermost first insulating layer of the plurality of first insulating layers;
a plurality of second wiring layers alternately formed in the plurality of second insulating layers at the first surface of the uppermost first insulating layer;
a plurality of second via wirings formed by filling metal in via holes in the plurality of second insulating layers, respectively,
wherein the plurality of first insulating layers are composed of non-photosensitive resin,
wherein the plurality of second insulating layers are composed of photosensitive resin,
wherein a lowermost second wiring layer has a stacked structure of a seed layer and an electrolytic plating layer stacked on the seed layer, the seed layer being a stacked body of two different metals,
wherein a first end surface of an uppermost first via wiring of the plurality of first via wirings embedded in the uppermost first insulating layer is exposed from the first surface of the uppermost first insulating layer and is directly connected to the seed layer of the lowermost second wiring layer, the lowermost second wiring layer in the plurality of second wiring layers being formed on the first surface of the uppermost first insulating layer and the first end surface of the uppermost first via wiring,
wherein the wiring density of the plurality of the second wiring layers is higher than the wiring density of the plurality of first wiring layers,
wherein the roughness of the first surface of the uppermost first insulating layer, on which the lowermost second wiring layer is directly formed, is smaller than the roughness of a surface of another first insulating layer of the plurality of first insulating layers on which one of the first wiring layers is directly formed, wherein the wiring board is a coreless substrate, wherein the thickness of the lowermost second wiring layer is thinner than that of an uppermost first wiring layer, and wherein the thickness a lowermost second insulating layer is thinner than the thickness of the uppermost first insulating layer.

10. The wiring board according to claim 9, wherein the uppermost first via wiring is formed such that the area at the first end surface of the uppermost first via wiring is larger than the area at a second end surface of the uppermost first via wiring, and wherein the first end surface of the uppermost first via wiring is directly connected to the lowermost second wiring layer.

11. The wiring board according to claim 9, wherein the uppermost first via wiring is formed such that the area at the first end surface of the uppermost first via wiring is smaller than the area at a second end surface of the uppermost first via wiring, and wherein the first end surface of the uppermost first via wiring is directly connected to the lowermost second wiring layer.

12. The wiring board according to claim 9, wherein the first insulating layer includes filler, and wherein each of the second insulating layers includes an amount of filler less than an amount of filler of the first insulating layer, or each of the second insulating layers does not include filler.

13. The wiring board according to claim 9, wherein a wiring width and a wiring space of the second wiring layer are smaller than a wiring width and a wiring space of the first wiring layer.

14. The wiring board according to claim 9, wherein roughness of the first surface of the uppermost first insulating layer is Ra 15 to 40 nm, and wherein roughness of a first surface of another first insulating layer of the plurality of first insulating layers on which the first wiring layer is formed is Ra 300 to 400 nm.

15. The wiring board according to claim 9, wherein the first end surface of the uppermost first via wiring is flush with the first surface of the uppermost first insulating layer.

16. The wiring board according to claim 9, wherein an interface exists between the uppermost first via wiring and the lowermost second wiring layer, wherein at least the first wiring layer formed below and contacting the uppermost first via wiring is integrally formed with another first via wiring of the plurality of first via wirings that is formed below the respective first wiring layer, and wherein at least the second via wiring formed above and contacting the lowermost second wiring layer is integrally formed with another second wiring layer of the plurality of second wiring layers that is formed above the respective second via wiring.

17. The wiring board according to claim 9, wherein the seed layer being a stacked body of titanium and copper.

\* \* \* \* \*